US012731766B2

(12) United States Patent
Peng et al.

(10) Patent No.: US 12,731,766 B2
(45) Date of Patent: Sep. 8, 2026

(54) SUBSTRATE SUPPORT INCLUDING MULTIPLE RADIO FREQUENCY (RF) ELECTRODES

(71) Applicant: BEIJING NAURA MICROELECTRONICS EQUIPMENT CO., LTD., Beijing (CN)

(72) Inventors: Yulin Peng, Beijing (CN); Jinrong Zhao, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 145 days.

(21) Appl. No.: 18/698,889

(22) PCT Filed: Aug. 25, 2022

(86) PCT No.: PCT/CN2022/114832
§ 371 (c)(1),
(2) Date: Apr. 5, 2024

(87) PCT Pub. No.: WO2024/040522
PCT Pub. Date: Feb. 29, 2024

(65) Prior Publication Data

US 2024/0321560 A1 Sep. 26, 2024

(51) Int. Cl.
*H01J 37/32* (2006.01)
*H10P 72/72* (2026.01)
*H10P 74/00* (2026.01)

(52) U.S. Cl.
CPC .. *H01J 37/32568* (2013.01); *H01J 37/32174* (2013.01); *H01J 37/32541* (2013.01);
(Continued)

(58) Field of Classification Search
None
See application file for complete search history.

(56) References Cited

U.S. PATENT DOCUMENTS 9,719,169 B2 * 8/2017 Mohn .................. C23C 16/401
9,741,546 B2 * 8/2017 Carducci ............ H01J 37/3244
(Continued)

FOREIGN PATENT DOCUMENTS

CN 101552183 A 10/2009
CN 110047725 A 7/2019
(Continued)

OTHER PUBLICATIONS

The World Intellectual Property Organization (WIPO) International Search Report for PCT/CN2022/114832 Dec. 20, 2022 3 Pages.

*Primary Examiner* — Srinivas Sathiraju
(74) *Attorney, Agent, or Firm* — Anova Law Group, PLLC

(57) ABSTRACT

The present disclosure generally relates to plasma semiconductor processing and processing tools for such processing. A processing tool includes a chamber and a substrate support. The substrate support is disposed inside the chamber. The substrate support includes a support surface configured to support a semiconductor substrate inside the chamber. The substrate support includes a plurality of radio frequency (RF) electrodes. The dimension of each lateral side of each RF electrode of the RF electrodes is equal to or less than 2% of a wavelength of an RF signal applied to the respective RF electrode. The respective dimension is in a plane parallel to the support surface. The RF electrodes are configured to control plasma in the internal volume in the chamber.

65 Claims, 9 Drawing Sheets

(52) U.S. Cl.
CPC .. *H01J 37/32577* (2013.01); *H01J 37/32715* (2013.01); *H10P 72/722* (2026.01); *H10P 74/238* (2026.01); *H01J 2237/3321* (2013.01); *H01J 2237/3341* (2013.01)

(56) References Cited

U.S. PATENT DOCUMENTS 10,163,610 B2 * 12/2018 Sriraman .......... H01J 37/32697
10,403,515 B2 * 9/2019 Basu ................. H01J 37/32357
10,580,620 B2 * 3/2020 Carducci ............. H01J 37/3244
10,615,006 B2 * 4/2020 Carducci ............. H01J 37/3244
10,636,684 B2 * 4/2020 Basu ................. H01J 37/32357
11,031,262 B2 * 6/2021 Basu ................. H01J 37/32357
11,270,896 B2 * 3/2022 Mohn ................. H10P 72/0434
11,293,099 B2 * 4/2022 Bansal ............. C23C 16/45565
11,315,760 B2 * 4/2022 Carducci ............. H01J 37/3244
11,417,502 B2 * 8/2022 Koshimizu ....... H01J 37/32091
11,898,236 B2 * 2/2024 Wang ................ H01J 37/32027
11,961,716 B2 * 4/2024 Wang ................ H01J 37/32899
12,068,136 B2 * 8/2024 Takeda ............. H01J 37/32449
12,183,604 B2 * 12/2024 Yu ........................... G03F 7/168
12,232,299 B2 * 2/2025 Decottignies ...... H05K 7/20318
12,387,912 B2 * 8/2025 Tye ..................... H01J 37/3171
12,406,871 B2 * 9/2025 Singu .................. H10P 72/7614
2009/0317962 A1 12/2009 Noda
2012/0258606 A1 10/2012 Holland et al.
2012/0258607 A1 10/2012 Holland et al.
2016/0314937 A1 * 10/2016 Carducci ............. H01J 37/3244
2017/0018411 A1 * 1/2017 Sriraman .......... H01J 37/32697
2020/0075296 A1 * 3/2020 Ohashi .............. H01J 37/32568
2020/0194233 A1 * 6/2020 Kao .................. H01J 37/32449
2020/0219701 A1 * 7/2020 Koshimizu ....... H01J 37/32183
2021/0166940 A1 * 6/2021 Nozawa .............. H01J 37/3244
2021/0183631 A1 * 6/2021 Yamagishi ........ H01J 37/32862
2021/0272782 A1 * 9/2021 Koshimizu ....... H01J 37/32862
2021/0407772 A1 * 12/2021 Koshimizu ....... H01J 37/32183
2022/0122810 A1 4/2022 Kubota
2022/0301834 A1 * 9/2022 Jung ................. H01J 37/32816
2022/0359170 A1 * 11/2022 Kilpi ................. H01J 37/32715
2023/0023864 A1 * 1/2023 Kato ................. H01J 37/32568
2023/0187184 A1 * 6/2023 Ishikawa ........... H01J 37/32568 216/67
2023/0307215 A1 * 9/2023 Matsudo ........... H01J 37/32834
2024/0321560 A1 * 9/2024 Peng ................. H01J 37/32568

FOREIGN PATENT DOCUMENTS

JP H11509358 A 8/1999
JP 2009253263 A 10/2009
JP 2012104559 A 5/2012
JP 2021533541 A 12/2021
WO WO-2016204860 A1 * 12/2016 .......... H01J 37/3299
WO 2018163935 A1 9/2018

* cited by examiner

SUBSTRATE SUPPORT INCLUDING MULTIPLE RADIO FREQUENCY (RF) ELECTRODES

CROSS-REFERENCE TO RELATED APPLICATIONS

This application is a national phase entry under 35 U.S.C. § 371 of International Application No. PCT/CN2022/114832, filed on Aug. 25, 2022, the entire contents of both of which are incorporated herein by reference.

BACKGROUND

Plasma processing has become ubiquitous in the semiconductor industry. Plasma semiconductor processes have been used to etch materials, deposit materials, or the like. Such plasma processes have been found to have improved processing qualities or resulting characteristics on the semiconductor substrate. For example, plasma enhanced chemical vapor deposition (PECVD) has been found to have advantages over previous chemical vapor deposition (CVD) processes, including lower deposition temperature, increased material purity, and improved step coverage. In plasma etch process, plasma is generally generated in a process chamber and may be accelerated by a surface electric field to achieved directional etch. However, the introduction of plasma has resulted in various challenges.

SUMMARY

A first embodiment described herein is a processing tool for semiconductor processing. The processing tool includes a chamber and a substrate support. The chamber has an internal volume within the chamber. The substrate support is disposed in the internal volume in the chamber. The substrate support includes a support surface configured to support a semiconductor substrate in the internal volume in the chamber. The substrate support includes a plurality of radio frequency (RF) electrodes. A dimension of each lateral side of each RF electrode of the plurality of RF electrodes is equal to or less than 2% of a wavelength of an RF signal applied to the respective RF electrode. The respective dimension is in a plane parallel to the support surface. The plurality of RF electrodes is configured to, at least in part, control plasma in the internal volume in the chamber.

A second embodiment is a processing tool for semiconductor processing. The processing tool includes a chamber and a substrate support. The chamber has an internal volume within the chamber. The substrate support is disposed in the internal volume in the chamber. The substrate support includes a support surface configured to support a semiconductor substrate in the internal volume in the chamber. The substrate support includes a plurality of radio frequency (RF) electrodes configured to, at least in part, control plasma in the internal volume in the chamber. A first RF electrode of the plurality of RF electrodes is disposed proximate a center of the support surface, and a second RF electrode of the plurality of RF electrodes is disposed proximate a periphery of the support surface. The first RF electrode and the second RF electrode intersect, laterally between the center and the periphery, an axis parallel to a radial direction in the support surface.

A third embodiment is a processing tool for semiconductor processing. The processing tool includes a chamber and a substrate support. The chamber has an internal volume within the chamber. The substrate support is disposed in the internal volume in the chamber. The substrate support includes a support surface configured to support a semiconductor substrate in the internal volume in the chamber. The substrate support includes a plurality of radio frequency (RF) electrodes configured to, at least in part, control plasma in the internal volume in the chamber. A dimension of each lateral side of each RF electrode of the plurality of RF electrodes is equal to or less than 221.1 millimeters, and the respective dimension is in a plane parallel to the support surface.

A fourth embodiment is a method for semiconductor processing. The method includes: generating plasma in a processing volume of a chamber of a processing tool. A substrate support is disposed in the chamber and supports, on a support surface, a semiconductor substrate. The semiconductor substrate is exposed to the plasma. The method further includes controlling the plasma including applying respective radio frequency (RF) signals to a plurality of RF electrodes disposed in the substrate support.

A fifth embodiment is a method for semiconductor processing. The method includes performing plasma semiconductor process having first process conditions on a first plurality of substrates using a processing tool. The processing tool includes a substrate support configured to support a substrate during the plasma semiconductor process. The substrate support includes a plurality of radio frequency (RF) electrodes configured to control, at least in part, plasma of the plasma semiconductor process. The first process conditions correspond to amplitudes and phases of RF signals applied to the plurality of RF electrodes during the plasma semiconductor process. The method includes measuring respective first characteristics of the first plurality of substrates corresponding to a first location of a first RF electrode of the plurality of RF electrodes during the plasma semiconductor process. The first characteristics are formed by the plasma semiconductor process. The method includes measuring respective second characteristics of the first plurality of substrates corresponding to a second location of a second RF electrode of the plurality of RF electrodes during the plasma semiconductor process. The second characteristics are formed by the plasma semiconductor process. The second location is different from the first location. The method includes, by a processor-based system, determining second process conditions to be applied while performing the plasma semiconductor process on a second plurality of substrates based on the first characteristics and the second characteristics. The second process conditions correspond to amplitudes and phases of RF signals to be applied to the plurality of RF electrodes during the plasma semiconductor process. The method includes performing the plasma semiconductor process having the second process conditions on the second plurality of substrates using the processing tool.

The foregoing summary outlines rather broadly various features of embodiments of the present disclosure in order that the following detailed description may be better understood. Additional features and advantages of such embodiments will be described hereinafter. The described examples may be readily utilized as a basis for modifying or designing other examples that are within the scope of the appended claims.

BRIEF DESCRIPTION OF THE DRAWINGS

So that the manner in which the above recited features can be understood in detail, reference is made to the following detailed description taken in conjunction with the accompanying drawings.

Figure 1:
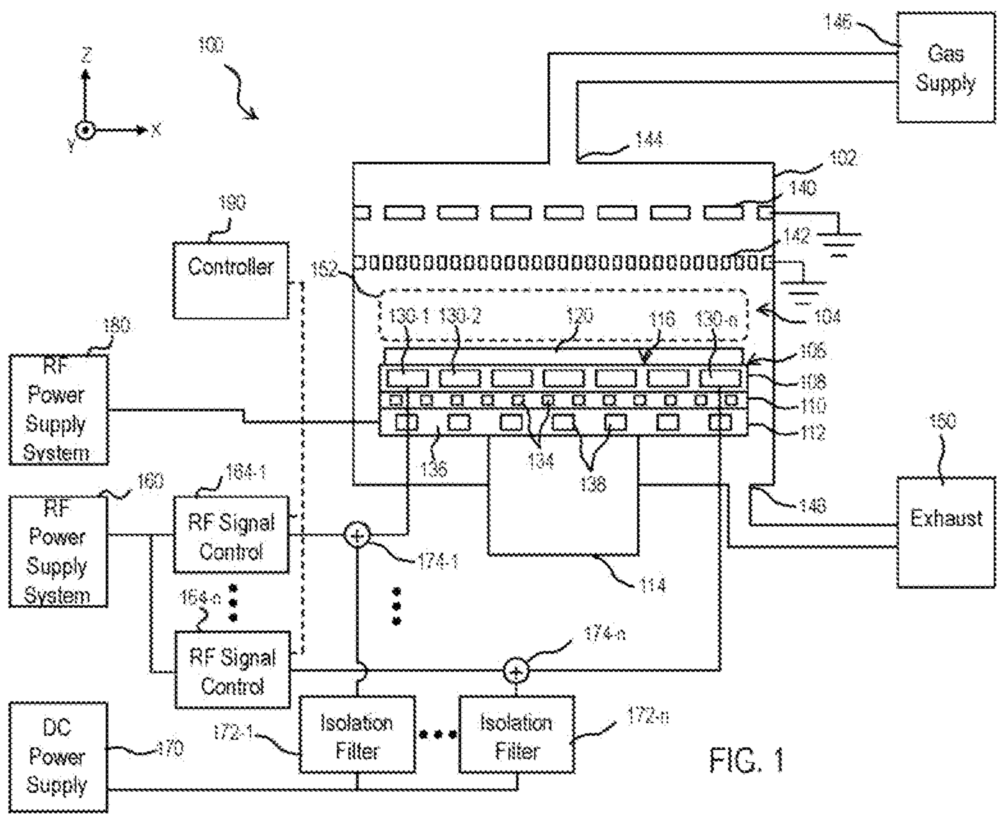
FIG. 1 is a schematic view of a processing tool for semiconductor processing according to some embodiments.

The drawings, and accompanying detailed description, are provided for understanding of features of various examples and do not limit the scope of the appended claims. The examples illustrated in the drawings and described in the accompanying detailed description may be readily utilized as a basis for modifying or designing other examples that are within the scope of the appended claims. Identical reference numerals may be used, where possible, to designate identical elements that are common among drawings. The figures are drawn to clearly illustrate the relevant elements or features and are not necessarily drawn to scale.

DETAILED DESCRIPTION

Various features are described hereinafter with reference to the figures. An embodiment may not have all the aspects or advantages shown. An aspect or an advantage described in conjunction with a particular embodiment is not necessarily limited to that embodiment and can be practiced in any other embodiments even if not so illustrated or if not so explicitly described. Further, methods described herein may be described in a particular order of operations, but other methods according to other embodiments may be implemented in various other orders (e.g., including different serial or parallel performance of various operations) with more or fewer operations.

The present disclosure relates to plasma semiconductor processing and processing tools for plasma semiconductor processing. Some embodiments described herein include a substrate support of a processing tool, where the substrate support includes multiple radio frequency (RF) electrodes configured to control plasma in the processing tool. Having multiple RF electrodes in the substrate support can permit more precise localized control of the plasma, and hence, can promote plasma uniformity.

Plasma non-uniformity in semiconductor processing can result in defective integrated circuit (IC) dies being manufactured. Plasma non-uniformity has been observed between the center of a semiconductor substrate (e.g., a wafer) and proximate an edge of the semiconductor substrate. Since a significant number of IC dies are manufactured proximate an edge of a semiconductor substrate, plasma non-uniformity at the edge of the semiconductor substrate can result in a significant loss of yield.

Various factors may contribute to plasma non-uniformity between a center and an edge of a semiconductor substrate. One factor is generally the physical structure of the processing tool. The physical structure of the processing tool can influence the flow of a gas during a semiconductor process, and such flow can be non-uniform throughout the chamber of the processing tool. This can result in varying concentrations of reactants and/or byproducts in the plasma at different locations. The physical structure of the processing tool can further determine, at least in part, the electromagnetic field used to generate the plasma. The structure of the electrodes between which the plasma is generated can determine the electromagnetic field. At the center of an electrode, the electromagnetic field may be modeled as generated from an infinite plane, with no or little edge effects. Near an edge of the electrode, edge effects become more pronounced, which can reduce and/or change the directionality of the electromagnetic field. As a result, the plasma density can be different at an edge of the semiconductor substrate compared to the center of the substrate. Further, the edge of the electrode is nearer to a wall of the chamber of the processing tool, which can create a low resistivity electromagnetic loop that can result in plasma density and ion energy difference between the center and edge.

Another factor can be the frequency of the RF signal used to generate the plasma and a lateral size of the electrode. Decreasing frequency (e.g., increasing wavelength) of the RF signal can result in a reduced electromagnetic field. Increasing frequency, on the other hand, may give rise to a finite wavelength effect that can impact uniformity of RF fields in the plasma. The non-uniformity problem may grow with increasing frequency and substrate size. For example, along the travelling direction of an electromagnetic wave, a difference in electromagnetic field intensity across a distance of 1% of the wavelength may be up to 6.28%. Even with the smoothest part of a wave, to achieve a field uniformity of better than 1%, the lateral size of an RF electrode may be equal to or less than 2% of the wavelength of the RF signal. In semiconductor process chambers, the upper frequency of an RF signal for 300 mm wafer size may be about 60 MHz. But at this frequency there may be significant non-uniformity of RF electromagnetic field on a semiconductor substrate.

According to some embodiments described herein, a substrate support includes multiple RF electrodes. In some embodiments, each RF electrode has lateral dimensions equal to or less than 2% of the wavelength of the RF signal applied to the RF electrode. Different RF signals can be applied to the RF electrodes. With an electromagnetic field on each of the RF electrode being approximately uniform, overall uniformity of electromagnetic field on a semiconductor substrate may become attainable through properly adjusting the RF signals applied to the RF electrodes. This may overcome the finite wavelength effect in plasma processing tools, allowing higher frequency RF power to be utilized for producing higher density plasma or for reducing surface electric field and associated surface erosion. With multiple independently controlled RF electrodes, profiles of electromagnetic field on a semiconductor substrate can also be adjusted to compensate for non-uniformities caused by other process parameters.

In some embodiments, two or more of the RF electrodes are disposed between a center and a periphery of a support surface and laterally intersect an axis parallel to a radial direction in the support surface. The substrate support includes the support surface, which is configured to support a semiconductor substrate during plasma semiconductor process. By having two or more of the RF electrodes aligned in such an arrangement, different RF signals can be applied to, e.g., an RF electrode proximate the center and an RF electrode proximate the edge. By applying such different RF signals, the plasma can be controlled differently at the edge relative to the center to thereby promote plasma uniformity. Such different RF signals applied can accommodate various other effects of the plasma semiconductor process that result in non-uniformity of the plasma.

In some embodiments, the different RF signals applied to the respective RF electrodes can have the same amplitude and phase to obtain uniform electromagnetic fields across a substrate larger than individual electrode, while in some other embodiments, the different RF signals applied to the respective RF electrodes can have different amplitudes and/or phases for achieving desired effects (e.g., compensation of non-uniformity due to other process parameters such as the edge effect).

In some embodiments, a dimension of each lateral side of each RF electrode in the substrate support is equal to or less than 221.1 millimeters (mm), which is approximately 2% of the wavelength of a signal having a frequency of 27.12 MHz. In some embodiments, a dimension of each lateral side of each RF electrode in the substrate support is equal to or less than 199.9 mm, which is approximately 2% of the wavelength of a signal having a frequency of 30 MHz. In some embodiments, a dimension of each lateral side of each RF electrode in the substrate support is equal to or less than 99.9 mm, which is approximately 2% of the wavelength of a signal having a frequency of 60 MHz. In some embodiments, a dimension of each lateral side of each RF electrode in the substrate support is in a range from 50.0 mm to 221.1 mm, from 50.0 mm to 199.9 mm, or from 50.0 mm to 99.9 mm, where 50.0 mm is approximately 2% of the wavelength of a signal having a frequency of 120 MHz. Having RF electrodes in the substrate support with such dimensions can reduce non-uniformity of plasma induced by wavelength impact and can reduce possible electromagnetic field vibration. Other advantages or benefits can be achieved using various aspects described herein.

For brevity and convenience, similar components shown in a figure may be referred to, either individually or collectively, by a same base reference numeral. In the figure, instances of such components may be labeled with the base reference numeral with a respective instance identifier (in the form of "-#") appended thereto. For example, the description may refer to x number of widgets ZZZ, where instances in the figure are labeled as ZZZ-1, ZZZ-2, . . . ZZZ-x. Reference to a specific instance of a component in the description includes reference to the base reference numeral and the corresponding instance identifier (e.g., instance of widget ZZZ-2).

FIG. 1 is a schematic view of a processing tool 100 for semiconductor processing according to some embodiments. FIG. 1 includes an X-Y-Z axis for ease of describing various orientations, and such axis is reproduced according to orientation in other figures. The processing tool 100 in FIG. 1 is illustrated simplistically so as to not obscure various aspects described herein. A person having ordinary skill in the art will readily understand other aspects of the processing tool 100. The processing tool 100 is shown as a capacitively coupled plasma (CCP) processing tool in this embodiment. In other embodiments, the processing tool 100 can be configured as an inductively coupled plasma (ICP) processing tool, electron cyclotron resonance (ECR) processing tool, or another processing tool. A person having ordinary skill in the art will readily understand aspects described herein as being applicable to such other processing tools. The processing tool 100 can be for performing plasma semiconductor process, such as sputtering, physical vapor deposition (PVD), modified double plasma (MDP), plasma-enhanced chemical vapor deposition (PECVD), ion beam etching (IBE), reactive ion etching (RIE), and other processes. The substrate to be processed can be a semiconductor wafer, a solar panel, a display panel, and/or other materials.

The processing tool 100 includes a chamber 102. The chamber 102 has an internal volume 104 that is defined by inner walls of the chamber 102. The processing tool 100 includes a substrate support 106 disposed in the internal volume 104 of the chamber 102. The substrate support 106 includes an electrostatic chuck (ESC) 108, a heater 110, and a baseplate 112. In the illustrated configuration, the heater 110 is disposed over and on the baseplate 112, and the ESC 108 is disposed over and on the heater 110. The substrate support 106 is disposed on and is supported by a pedestal 114. The baseplate 112 is disposed over and on the pedestal 114. The substrate support 106 has a support surface 116 that is configured to support a semiconductor substrate 120 during a semiconductor process. During a semiconductor process, a semiconductor substrate 120 is disposed on the support surface 116 of the substrate support 106. The support surface 116, in the illustration of FIG. 1, is in an x-y plane.

The ESC 108 includes n number of RF electrodes 130. As described in more detail subsequently, the RF electrodes 130 are configured to have an RF voltage signal applied thereto, and may further have a direct current (DC) voltage applied thereto. The ESC 108 can include a dielectric material that coats the RF electrodes 130 to provide electrical isolation from direct contact between the RF electrodes 130. The dielectric material can be or include aluminum oxide (Al2O3), yttrium oxide (Y2O3), silicon oxide (SiO2), the like, or a combination thereof. The RF electrodes 130 can be or include any metal, such as aluminum (Al), copper (Cu), titanium (Ti), tungsten (W), the like, or a combination thereof. Various arrangements and configurations of RF electrodes 130 are illustrated in subsequent figures.

The heater 110 includes one or more resistive heating elements 134 disposed in a dielectric, heat-conducting material. An electrical current can flow through the one or more resistive heating elements 134, which can generate thermal energy that is conducted to the semiconductor substrate 120.

The baseplate 112 includes a bias electrode 136 and fluid channels 138. In this embodiment, the baseplate 112 includes a single bias electrode 136, and as detail in subsequent embodiment, the baseplate 112 may also include multiple bias electrodes. The bias electrode 136 may have a dielectric material thereon to provide electrical isolation from direct contact of the bias electrode 136 to other components. The fluid channels 138 are disposed embedded in the bias electrode 136. The fluid channels 138 are configured to have a fluid (e.g., a liquid) flowing therethrough to remove and dissipate thermal energy from the semiconductor substrate 120. The fluid channels 138 may be referred to as a cooler.

The processing tool 100 further includes a gas distribution plate 140 and a gas showerhead 142 disposed in the internal volume 104 of the chamber 102. The gas distribution plate 140 has openings therethrough, and the gas showerhead 142 has openings therethrough. The gas distribution plate 140 and the gas showerhead 142 are electrically coupled to a ground node (e.g., are electrically grounded). The chamber 102 has a gas inlet 144 fluidly coupled to a gas supply system 146, and has a gas outlet 148 fluidly coupled to an exhaust system 150. The gas distribution plate 140 and gas showerhead 142 are positioned in the internal volume 104 of the chamber 102 relative to the substrate support 106 such that, during a semiconductor process, a gas flows from the gas supply system 146, through the gas inlet 144, through the openings through the gas distribution plate 140, and then through the openings through the gas showerhead 142 to a processing volume 152 in the internal volume 104. The processing volume 152 is disposed between the gas showerhead 142 and the substrate support 106 and is generally where plasma is generated (using the gas flowed into the processing volume 152) during a semiconductor process. A semiconductor substrate 120 disposed on the support surface 116 of the substrate support 106 is exposed to plasma in the processing volume 152 during the semiconductor process. The gas can then flow through the gas outlet 148 to the exhaust system 150 to be exhausted out of the internal volume 104 of the chamber 102.

The processing tool 100 includes a power system that includes an RF power supply system 160, n number of RF signal control circuits 164, a DC power supply 170, n number of isolation filters 172, and n number of analog summer/adder circuits 174. The RF power supply system 160 may include an RF generator and an RF matching network, and is configured to generate and output an RF signal, which may be a continuous RF signal and/or a pulsed RF signal, on an output node of the RF power supply system 160. The output node of the RF power supply system 160 is electrically coupled to input nodes of the RF signal control circuits 164. As detailed subsequently, each RF signal control circuit 164 is individually or independently controllable to generate an adjusted RF signal based on the RF signal received from the RF power supply system 160. The adjusted RF signal generated by an RF signal control circuit 164 may have an adjusted amplitude (e.g., by a gain of the RF signal control circuit 164, which may have a magnitude greater than, equal to, or less than 1) of the received RF signal and/or may have a phase offset from the received RF signal. The gain and/or phase offset may be selectable from a set of gains and/or phase offsets, respectively, that a respective RF signal control circuit 164 is configured to implement. Each RF signal control circuit 164 has an output node that is electrically coupled to a first input node of a corresponding analog summer/adder circuit 174. The DC power supply 170 is configured to generate and output a DC voltage on an output node of the DC power supply 170. The output node of the DC power supply 170 is electrically coupled to respective input nodes of the isolation filters 172, and output nodes of the isolation filters 172 are electrically coupled to respective second input nodes of the analog summer/adder circuits 174. Each isolation filter 172 is configured to suppress time-variant signals, such as RF signals. Each isolation filter 172 may be a low pass filter, for example. Each analog summer/adder circuit 174 is configured to sum or add the adjusted RF signal from a respective RF signal control circuit 164 to the DC voltage from the respective isolation filter 172 and the DC power supply 170 and output the resulting RF/DC signal on an output node of the respective analog summer/adder circuit 174. Each analog summer/adder circuit 174 is electrically coupled to a respective RF electrode 130 of the ESC 108.

During operation, the RF/DC signal output by a given analog summer/adder circuit 174 is applied to the respective RF electrode 130 to which the analog summer/adder circuit 174 is electrically coupled. The DC component of the RF/DC signal (which is generated by the DC power supply 170) can be used for chucking the semiconductor substrate 120 on the support surface 116 of the substrate support 106. The RF component of the RF/DC signal (which is output by the corresponding RF signal control circuit 164) can be used for generating and/or controlling plasma in the processing volume 152. By having multiple RF electrodes 130, each with a corresponding independently controllable RF signal control circuit 164 for generating the RF component of the RF/DC signal, RF signals for generating and controlling plasma can be different at different locations in the substrate support 106. By permitting different RF signals at different locations, the plasma may be locally controlled to promote increased uniformity, and thereby, increased uniformity of the resulting structures formed by the semiconductor process. For clarity, as used herein, the RF/DC signal may include a DC component without an RF component, and vice versa; however, in some embodiments, the RF/DC signal includes both an RF component and a DC component.

The processing tool 100 includes an RF power supply system 180. The RF power supply system 180 may include an RF generator and an RF matching network, and is configured to generate and output an RF signal, which may be a continuous RF signal and/or a pulsed RF signal, on an output node of the RF power supply system 180. The output node of the RF power supply system 180 is electrically coupled to the bias electrode 136 of the baseplate 112. The baseplate 112, in this embodiment, may be strongly capacitively coupled to the RF electrodes 130 in the ESC 108. Hence, according to some embodiments, the baseplate 112 is biased by the RF signal output by the RF power supply system 180 to increase drivability of the RF electrodes 130 to generate plasma.

In some embodiments, the RF power supply system 180 can operate at the same frequency of the RF power supply system 160. The RF power supply system 180, during operation, outputs an RF signal that has a target amplitude and a target phase offset relative to the RF components of the RF/DC signals applied to the RF electrodes 130. In some embodiments, the RF signal output by the RF power supply system 180 has an amplitude that is the average amplitude of the RF components of the RF/DC signals applied to the RF electrodes 130. Further, in some embodiments, the RF signal output by the RF power supply system 180 has a phase offset that permits the RF signal to be in phase with the average of the RF components of the RF/DC signals. Having such an RF signal applied to the bias electrode 136 of the baseplate 112 permits increased drivability of the RF electrodes 130 to generate and control plasma. In some embodiments, the RF power supply system 180 can operate at a different frequency than that of RF power supply system 160 for providing dual-frequency operation of plasma process. For example, the RF power supply system 180 may operate at a frequency lower than that of RF power supply system 160. The power of a lower frequency RF electric field may be coupled more to the plasma sheath relative to higher frequency RF. Such dual-frequency operation can allow adjustment of fractions of RF power delivered to plasma sheath and to the main plasma. This can provide relatively separate control of plasma density and ion energy at the substrate.

The processing tool 100 includes a controller 190. The controller 190 can be or include any processor-based system, which may be or include a hardened processor architecture, a soft processor (e.g., implemented on programmable fabric of a field programmable gate array (FPGA)), or a combination thereof. For example, the controller 190 can be or include a computer, a server, a programmable logic controller (PLC), the like, or a combination thereof. The controller 190 can control operation of the processing tool 100 and can be programmed to implement operations of the processing tool 100 as described herein. Among other things, the controller 190 is communicatively coupled to the RF signal control circuits 164. The controller 190 can be programmed to implement various setpoints for controlling the RF signal control circuits 164.

Although the RF electrodes 130 in reference to the processing tool 100 of FIG. 1 are described as implemented to generate plasma in the chamber 102, the RF electrodes 130 may be bias electrodes in the substrate support in other processing tools, such as an ICP processing tool. Aspects described herein can be applicable to other tools and configurations to control plasma.

FIGS. 2, 3, 4, 5, and 6 are layout views of arrangements 200, 300, 400, 500, 600 of RF electrodes 230, 330, 430, 530, 630, respectively, according to some embodiments. The RF electrodes 130 in the ESC 108 of FIG. 1 can have any of the arrangements 200, 300, 400, 500, 600 shown in FIGS. 2, 3, 4, 5, and 6, or any other arrangement. The arrangements 200, 300, 400, 500, 600 are shown in an x-y plane, which is parallel to the support surface 116 that supports a semiconductor substrate 120. An edge 202, 302, 402, 502, 602 of the respective arrangement 200, 300, 400, 500, 600 is circular and corresponds (e.g., is in vertical alignment) with the edge of the support surface 116 of the substrate support 106. Other shapes of the edge 202, 302, 402, 502, 602 can be implemented. A center 204, 304, 404, 504, 604 of the respective arrangement 200, 300, 400, 500, 600 is shown and corresponds (e.g., is in vertical alignment) with a center of the support surface 116.

Figure 2:
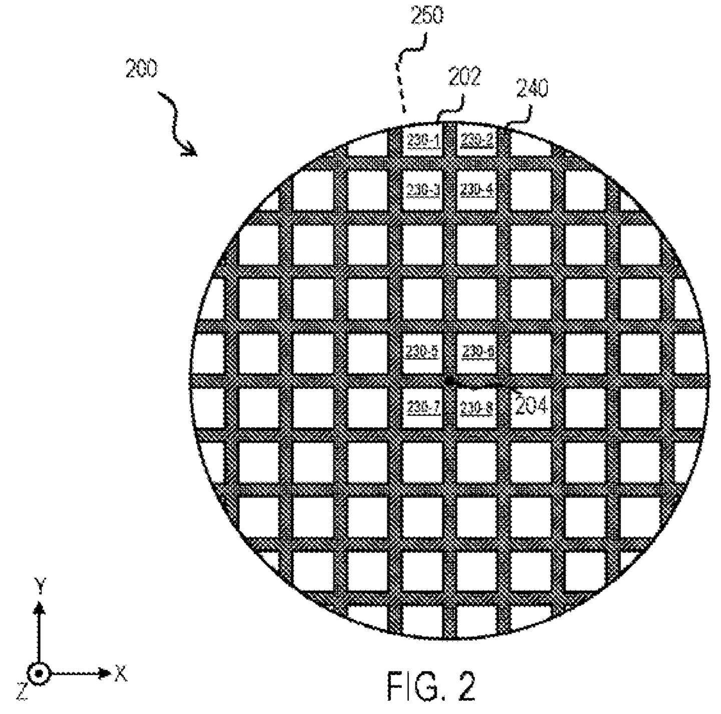
FIGS. 2, 3, 4, 5, and 6 are layout views of arrangements of radio frequency (RF) electrodes according to some embodiments.

Referring to FIG. 2, the arrangement 200 includes RF electrodes 230. In some embodiments, the arrangement 200 includes 10 to 200 RF electrodes 230. The arrangement 200 is a linear grid of RF electrodes 230. In this embodiment, the RF electrodes 230 are rectangular (e.g., squares), except the RF electrodes 230 that intersect the edge 202. For example, RF electrodes 230-1, 230-2 at the edge 202 have an arc as a lateral side, with other straight line lateral sides. Other RF electrodes 230 (e.g., RF electrodes 230-3 through 230-8) are rectangular (e.g., having straight line lateral sides). RF electrodes 230-5, 230-6, 230-7, 230-8 are shown proximate the center 204 of the arrangement 200. A dielectric material 240 is disposed between neighboring RF electrodes 230 to prevent direct electrical contact between the neighboring RF electrodes 230.

Figure 3:
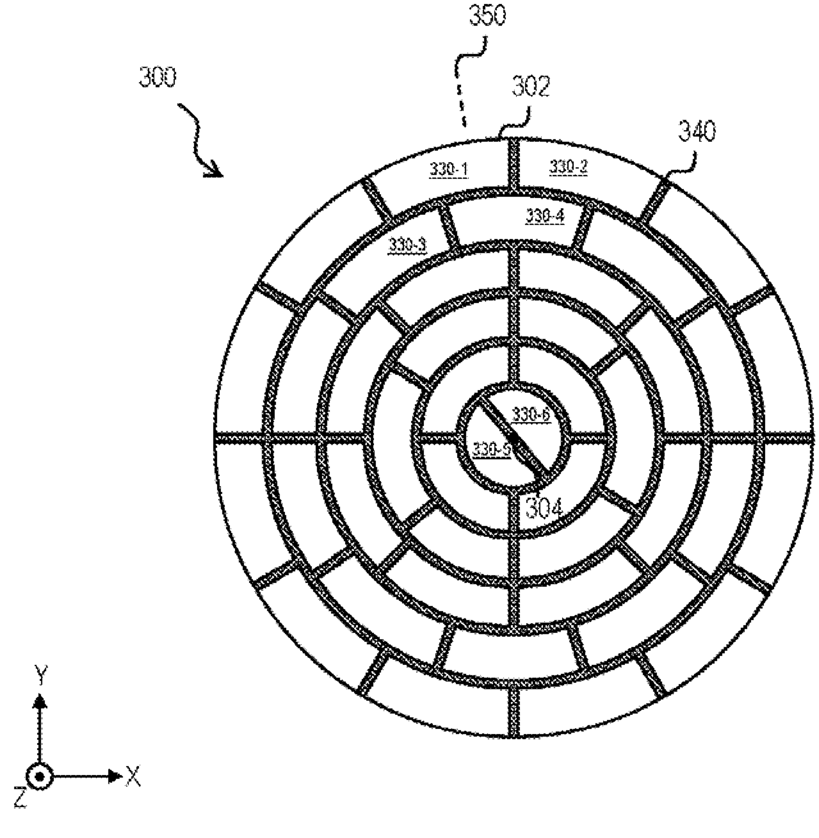

Referring to FIG. 3, the arrangement 300 includes RF electrodes 330. In some embodiments, the arrangement 300 includes 6 to 200 RF electrodes 330. The arrangement 300 is segmented concentric rings encircling a segmented inner circle of RF electrodes 330. In this embodiment, each RF electrode 330 is a segment of a circle or a segment of a concentric ring. For example, RF electrodes 330-5, 330-6 proximate the center 304 are each a segment (e.g., a semicircle) of an inner circle, and RF electrodes 330-1, 330-2 at the edge 302 are each a segment of an outer concentric ring. As shown in FIG. 3, five concentric rings of RF electrodes 330 encircle the segments of the inner circle of RF electrodes 330-5, 330-6, and in other embodiments, any number of concentric rings can be implemented. Each RF electrode 330 in a concentric ring is segmented from neighboring RF electrodes within that concentric ring in a respective direction perpendicular to a radial direction from the center 304. Each RF electrode 330 in a concentric ring has an inner arc lateral side, an outer arc lateral side, and opposing straight line lateral sides (e.g., that extend in a radial direction from the center 304). A dielectric material 340 is disposed between neighboring RF electrodes 330 to prevent direct electrical contact between the neighboring RF electrodes 330.

Figure 4:
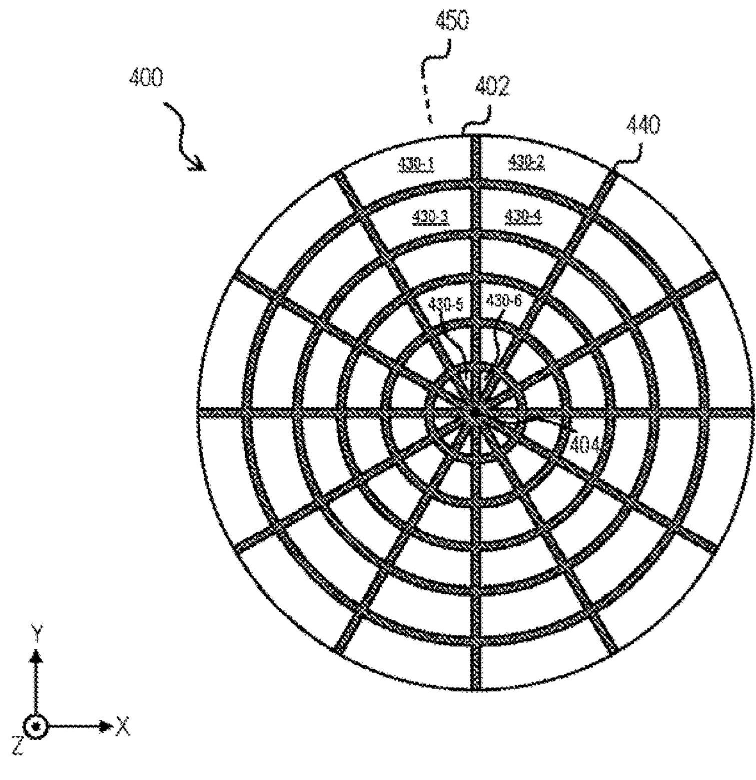

Referring to FIG. 4, the arrangement 400 includes RF electrodes 430. In some embodiments, the arrangement 400 includes 6 to 200 RF electrodes 430. The arrangement 400 is radially aligned segmented concentric rings encircling a sectored inner circle of RF electrodes 430. In this embodiment, each RF electrode 430 is a sector of a circle or a segment of a concentric ring. The segments of the concentric rings are radially aligned with the sectors of the inner circle in the arrangement 400. In the illustrated embodiment of FIG. 4, the arrangement 400 has twelve sectors (e.g., each sector being 30°). The inner circle and each concentric ring in the arrangement 400 has a sector or segment in each of the twelve sectors. Other numbers of sectors can be implemented in other embodiments. As an example, RF electrodes 430-5, 430-6 proximate the center 404 are each a sector of the inner circle, and RF electrodes 430-1, 430-2 at the edge 402 are each a segment of an outer concentric ring. In other arrangements, the inner circle of RF electrodes may be a full circle of a single RF electrode as opposed to a sectored circle of multiple RF electrodes. Five concentric rings of RF electrodes 430 around the inner circle of RF electrodes (e.g., RF electrodes 430-5, 430-6) are shown in FIG. 4, and in other embodiments, any number of concentric rings can be implemented. Each RF electrode 430 is segmented from neighboring RF electrodes within the respective inner circle or concentric ring in a respective direction perpendicular to a radial direction from the center 404. Each RF electrode 430 in the inner circle has straight line lateral sides (e.g., that extend in a radial direction from the center 404) and an outer arc lateral side. Each RF electrode 430 in a concentric ring has an inner arc lateral side, an outer arc lateral side, and opposing straight line lateral sides (e.g., that extend in a radial direction from the center 404). A dielectric material 440 is disposed between neighboring RF electrodes 430 to prevent direct electrical contact between the neighboring RF electrodes 430.

Figure 5:
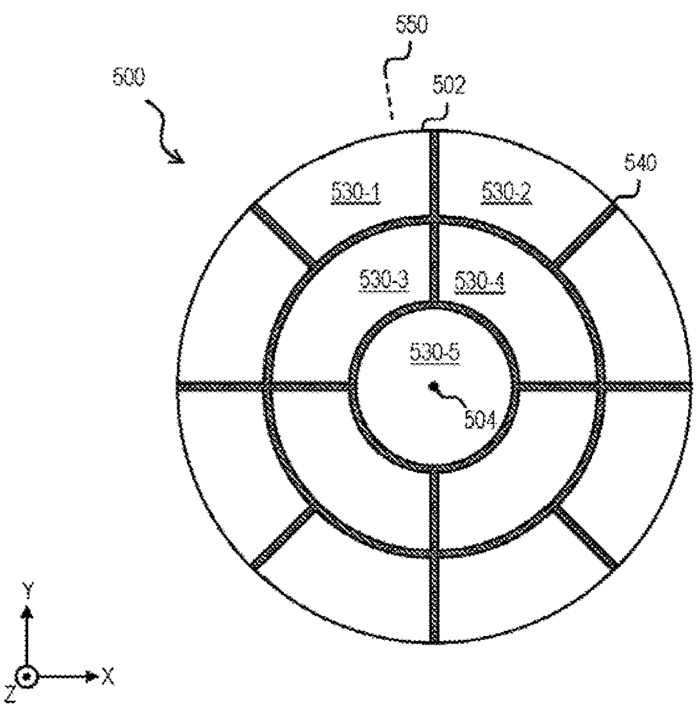

Referring to FIG. 5, the arrangement 500 includes RF electrodes 530. In some embodiments, the arrangement 500 includes 5 to 200 RF electrodes 530. The arrangement 500 is segmented concentric rings encircling a full inner circle of RF electrodes 530. In this embodiment, the full inner circle RF electrode 530-5 is at the center 504, and each other RF electrode 530 is a segment of a concentric ring. Two concentric rings of RF electrodes 530 around the full inner circle RF electrode 530-5 are shown in FIG. 5, and in other embodiments, any number of concentric rings can be implemented. Each RF electrode 530 in a concentric ring is segmented from neighboring RF electrodes 530 within that concentric ring in a respective direction perpendicular to a radial direction from the center 504. The full inner circle RF electrode 530-5 has a lateral circumference. Each RF electrode 530 in a concentric circle has an inner arc lateral side, an outer arc lateral side, and opposing straight line lateral sides (e.g., that extend in a radial direction from the center 504). A dielectric material 540 is disposed between neighboring RF electrodes 530 to prevent direct electrical contact between the neighboring RF electrodes 530.

In the arrangements 200, 300, 400, 500 of FIGS. 2, 3, 4, and 5, for a given radial direction, different RF electrodes are disposed intersecting an axis parallel to the radial direction in the support surface 116 from the center of the support surface 116 to the periphery of the support surface 116. Such an axis that is parallel to the radial direction in the support surface 116 may be, for example, in the arrangements 200, 300, 400, 500, from the center 204, 304, 404, 504 to the edge 202, 302, 402, 502, respectively. For example, referring to FIG. 2, RF electrodes 230-1, 230-5 are disposed intersecting an axis from the center 204 to the edge 202 along line 250. Similarly, for example, referring to FIG. 3, RF electrodes 330-1, 330-6 are disposed intersecting an axis from the center 304 to the edge 302 along line 350. Referring to FIG. 4, RF electrodes 430-1, 430-5 are disposed intersecting an axis from the center 404 to the edge 402 along line 450. Referring to FIG. 5, RF electrodes 530-1, 530-5 are disposed intersecting an axis from the center 504 to the edge 502 along line 550. By having different RF electrodes disposed at the center and the periphery of the support surface 116, different RF signals can be applied at the center and the periphery to localize control of the plasma and to promote uniformity of the plasma.

Figure 6:
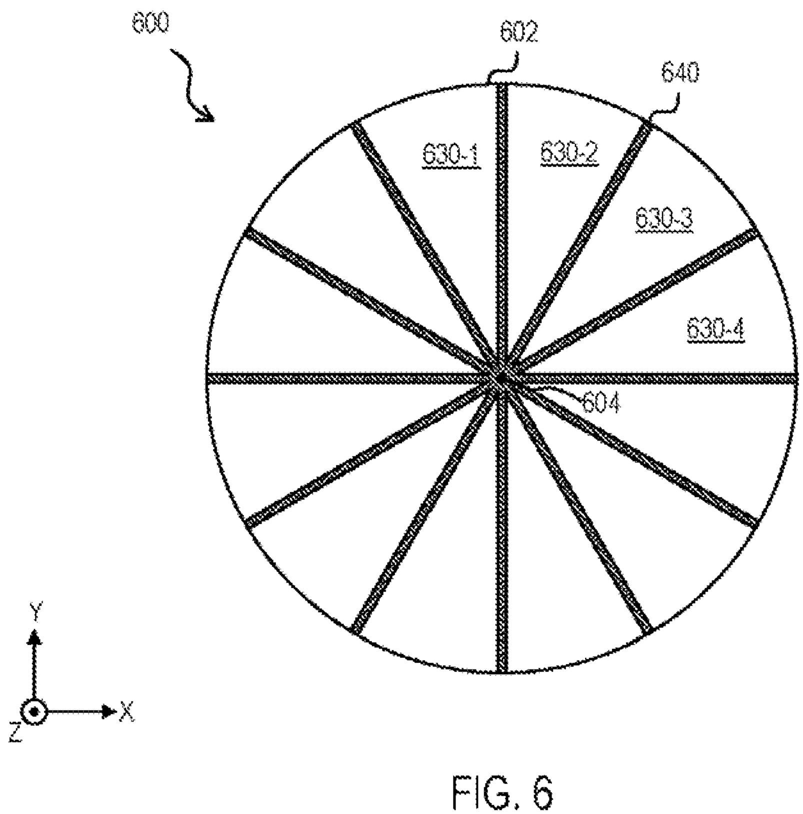

Referring to FIG. 6, the arrangement 600 includes RF electrodes 630. The arrangement 600 is a sectored circle of RF electrodes 630. In this embodiment, each RF electrode 630 is a sector of a circle. In the illustrated embodiment of FIG. 6, the arrangement 600 has twelve sectors (e.g., each sector being 30°). Other numbers of sectors can be implemented in other embodiments. Each RF electrode 630 extends from proximate the center 604 to the edge 602. Each RF electrode 630 is segmented from neighboring RF electrodes in a respective direction perpendicular to a radial direction from the center 604. Each RF electrode 630 has straight line lateral sides (e.g., that extend in a radial direction from the center 604) and an outer arc lateral side. A dielectric material 640 is disposed between neighboring RF electrodes 630 to prevent direct electrical contact between the neighboring RF electrodes 630.

Figure 7A:
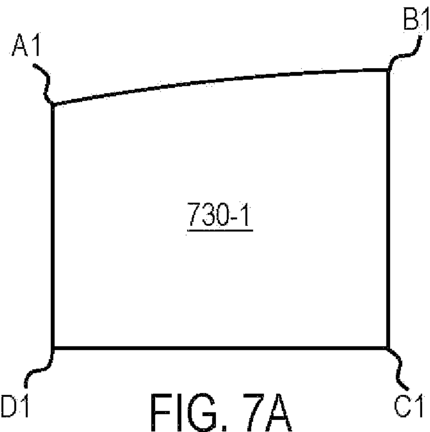
FIGS. 7A, 7B, 7C, and 7D are layout views of various RF electrodes of FIGS. 2 through 6 according to some embodiments.
Figure 7B:
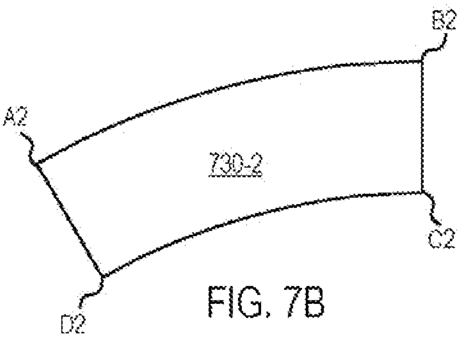
Figure 7C:
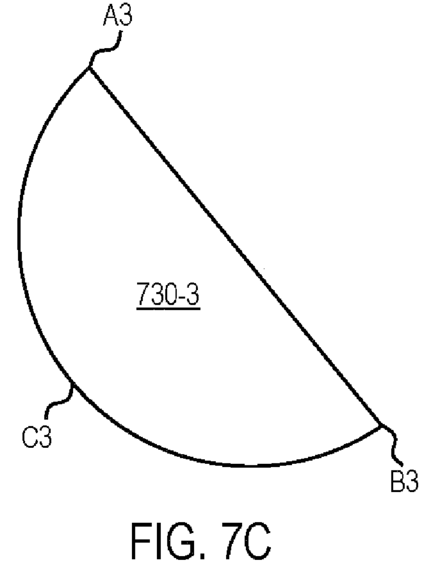
Figure 7D:
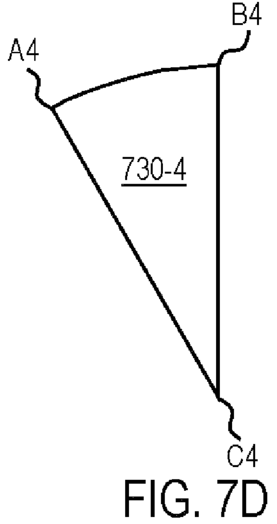

FIGS. 7A, 7B, 7C, and 7D are layout views of various RF electrodes of FIGS. 2 through 6 according to some embodiments. The RF electrodes in FIGS. 7A through 7D are shown to illustrate various lateral sides. FIG. 7A is a layout view of an RF electrode 730-1, which may be an RF electrode 230 intersecting the edge 202 in FIG. 2. The RF electrode 730-1 has vertexes A1, B1, C1, D1. The RF electrode 730-1 has an arc lateral side A1-B1, a straight line lateral side B1-C1, a straight line lateral side C1-D1, and a straight line lateral side D1-A1. FIG. 7B is a layout view of an RF electrode 730-2, which may be an RF electrode 330, 430, 530 as a segment of a concentric ring in FIGS. 3, 4, and 5. The RF electrode 730-2 has vertexes A2, B2, C2, D2. The RF electrode 730-2 has an outer arc lateral side A2-B2, a straight line lateral side B2-C2, an inner arc lateral side C2-D2, and a straight line lateral side D2-A2. FIG. 7C is a layout view of an RF electrode 730-3, which may be an RF electrode 330-5, 330-6 as a segment of an inner circle in FIG. 3. The RF electrode 730-3 has vertexes A3, B3 and arc point C3. The RF electrode has a straight line lateral side A3-B3 and an arc lateral side A3-C3-B3. FIG. 7D is a layout view of an RF electrode 730-4, which may be an RF electrode 430, 630 as a sector of a circle in FIGS. 4 and 6. The RF electrode 730-4 has vertexes A4, B4, C4. The RF electrode 730-4 has an arc lateral side A4-B4, a straight line lateral side B4-C4, and a straight line lateral side C4-A4.

In some embodiments, a dimension of each lateral side of each RF electrode 230, 330, 430, 530, 630 in the arrangement 200, 300, 400, 500, 600 is less than 2% of the smallest wavelength of the respective RF signal (and hence, the electromagnetic field) applied to the respective RF electrode. In some embodiments, the RF signal may be a multi-frequency RF signal, and hence, the smallest wavelength may be the RF signal with the highest frequency in the multi-frequency RF signal.

In some embodiments, a dimension of each lateral side of each RF electrode 230, 330, 430, 530, 630 in the arrangement 200, 300, 400, 500, 600 is less than 221.1 mm, and more particularly, is less than 199.9 mm, and even further, is less than 99.9 mm. In some embodiments, a dimension of each lateral side of each RF electrode 230, 330, 430, 530, 630 in the arrangement 200, 300, 400, 500, 600 is in a range from greater than 50.0 mm to less than 221.1 mm, and more particularly, is in a range from greater than 50.0 mm to less than 199.9 mm, and even further, is in a range from greater than 50.0 mm to less than 99.9 mm. FIGS. 7A through 7D show lateral sides of example RF electrodes 730. Additionally, a lateral side can include, where present, a circumference lateral side of a full circle RF electrode, such as the RF electrode 530-5 in FIG. 5, and a straight line lateral side of a rectangular RF electrode, such as the RF electrode 330-5 in FIG. 3. By having lateral sides be such dimensions, non-uniformity of plasma induced by wavelength impact can be reduced, and electromagnetic field vibration can be reduced. For processing materials other than semiconductor wafers, the size and shape of the substrate support as well as the frequency of RF electromagnetic field may vary. The method of using a plurality of RF electrodes having dimensions equal to or less than 2% of RF wavelength to reduce non-uniformity due to wavelength effect may still apply.

Figure 8:
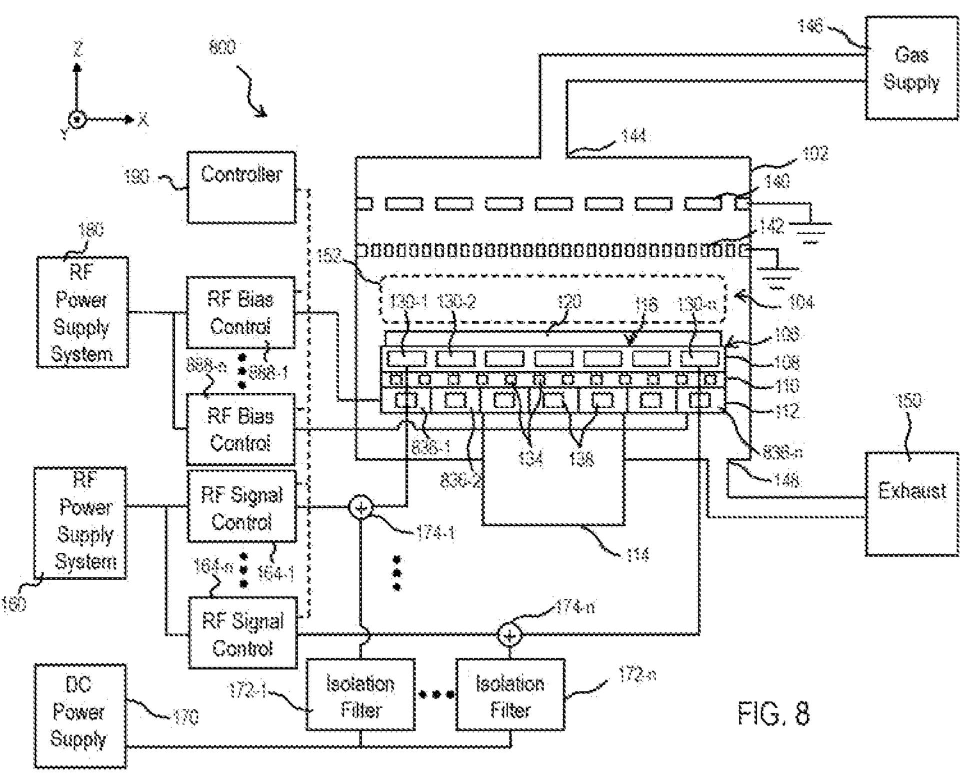
FIG. 8 is a schematic view of a processing tool for semiconductor processing according to some embodiments.

FIG. 8 is a schematic view of a processing tool 800 for semiconductor processing according to some embodiments. The processing tool 800 of FIG. 8 is a modification of the processing tool 100 of FIG. 1, and hence, like reference numerals in the figures indicate like components. Description of like components is omitted here for brevity.

The baseplate 112 of the substrate support 106 in the processing tool 800 includes n number of bias electrodes 836. An arrangement of the bias electrodes 836 in the baseplate 112 corresponds to the arrangement of RF electrodes 130 in the ESC 108. For example, each bias electrode 836 generally can have the same shape and can be vertically aligned (e.g., in a z-direction) with a corresponding RF electrode 130.

The processing tool 800 further includes n number of RF bias control circuits 888. Each RF bias control circuit 888 has an input node electrically coupled to the output node of the RF power supply system 180. Like the RF signal control circuits 164, each RF bias control circuit 888 is individually or independently controllable to generate an adjusted RF signal based on the RF signal received from the RF power supply system 180. The adjusted RF signal generated by an RF bias control circuit 888 may have an adjusted amplitude (e.g., by a gain of the RF bias control circuit 888, which may have a magnitude greater than, equal to, or less than 1) of the received RF signal and/or may have a phase offset from the received RF signal. The gain and/or phase offset may be selectable from a set of gains and/or phase offsets, respectively, that a respective RF bias control circuit 888 is configured to implement. Each RF bias control circuit 888 has an output node that is electrically coupled to a respective bias electrode 836.

During operation, the RF power supply system 180 outputs an RF bias signal to the RF bias control circuits 888. The RF bias signal is generated based on the RF signal output by the RF power supply system 180 and can be, for example, frequency, phase, and amplitude matched by an RF matching network of the RF power supply system 180 according to the RF signal output by the RF power supply system 160. The RF bias control circuits 888 adjust the RF bias signal to a respective adjusted RF bias signal to have a target gain and target phase offset. The adjusted RF bias signal is output by the respective RF bias control circuit 888 to the respective bias electrode 836. The adjusted RF bias signal output by a respective RF bias control circuit 888 can have an amplitude and phase offset that corresponds to the RF signal output by a corresponding RF signal control circuit 164. For example, the adjusted RF bias signal output by a RF bias control circuit 888-1 can have an amplitude and phase offset that corresponds to the RF signal output by the RF signal control circuit 164-1, and the adjusted RF bias signal output by a RF bias control circuit **888-*n* can have an amplitude and phase offset that corresponds to the RF signal output by the RF signal control circuit 164-*n***.

By having multiple bias electrodes 836, each with a corresponding independently controllable RF bias control circuit 888 for generating an adjusted RF bias signal, RF bias signals for biasing the substrate support 106 can be different at different locations in the substrate support 106. By permitting different RF bias signals at different locations, the drivability of the RF electrodes 130 may be more precise and may be increased to promote increased uniformity of plasma, and thereby, to increase uniformity of the resulting structures formed by the semiconductor process.

Figure 9:
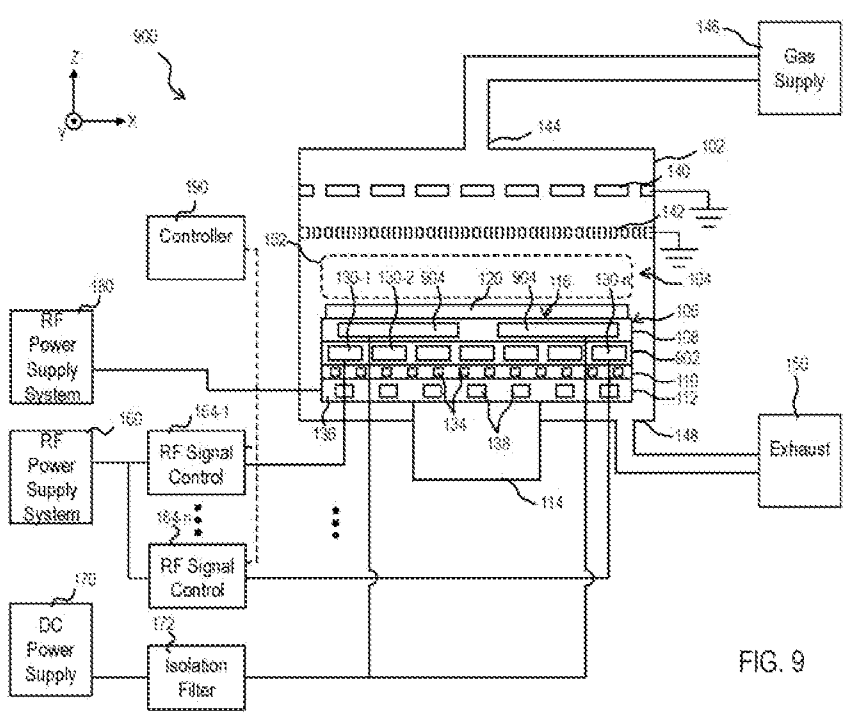
FIG. 9 is a schematic view of a processing tool for semiconductor processing according to some embodiments.

FIG. 9 is a schematic view of a processing tool 900 for semiconductor processing according to some embodiments. The processing tool 900 of FIG. 9 is a modification of the processing tool 100 of FIG. 1, and hence, like reference numerals in the figures indicate like components. Description of like components is omitted here for brevity.

The substrate support 106 further includes a mid-plate 902. In the illustrated configuration, the heater 110 is disposed over and on the baseplate 112; the mid-plate 902 is disposed over and on the heater 110; and the ESC 108 is disposed over and on the mid-plate 902. The ESC 108 includes chuck electrodes 904. The chuck electrodes 904 are configured to have a DC voltage applied thereto for chucking. The ESC 108 can include a dielectric material that coats the chuck electrodes 904 to provide electrical isolation from direct contact between the chuck electrodes 904. The mid-plate 902 includes n number of RF electrodes 130. As described previously, the RF electrodes 130 are configured to have an RF voltage signal applied thereto. The mid-plate 902 can include a dielectric material that coats the RF electrodes 130 to provide electrical isolation from direct contact between the RF electrodes 130.

Output nodes (e.g., a positive output node and a negative output node) of the DC power supply 170 are electrically coupled to input nodes of an isolation filter 172, and output nodes of the isolation filter 172 are electrically coupled to respective chuck electrodes 904. The isolation filter 172 may be, for example, a low pass filter. The DC power supply 170 can be selectively turned on and off to chuck and release a semiconductor substrate 120.

Each RF signal control circuit 164 has an output node that is electrically coupled to a corresponding RF electrode 130. In the processing tool 900 of FIG. 9, respective RF signals can be applied to the RF electrodes 130 (e.g., to generate and/or control plasma), while a DC voltage can be applied to the chuck electrodes 904 (e.g., for chucking a semiconductor substrate).

In some embodiments, a processing tool may be like the processing tool 900 of FIG. 9, except with the baseplate 112 including n number of bias electrodes 836 and with the RF power supply system 180 and the RF bias control circuits 888 like described with respect to the processing tool 800 of FIG. 8.

Figure 10:
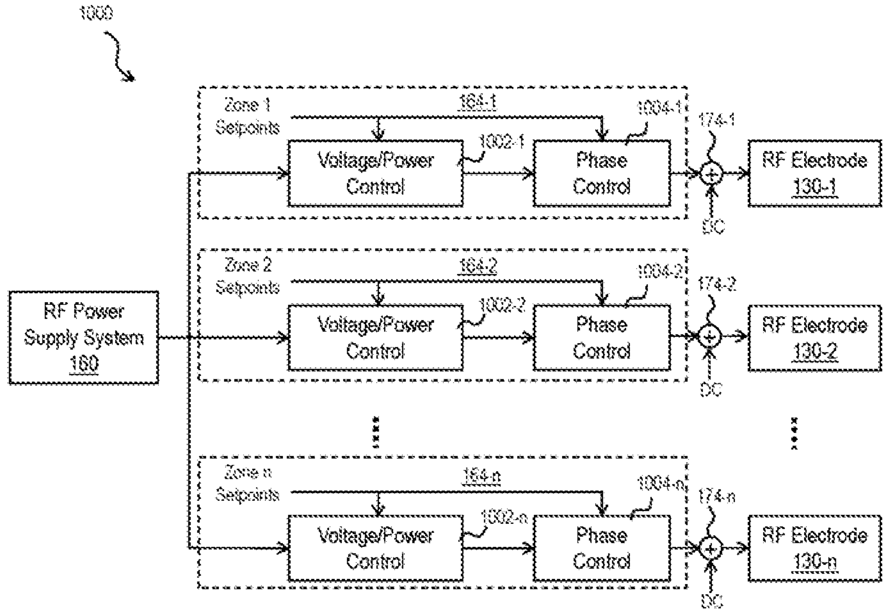
FIG. 10 is a schematic of the RF power system of the processing tool of FIGS. 1, 8, and 9 according to some embodiments.

FIG. 10 is a schematic of the RF power system 1000 of the processing tool 100, 800, 900 according to some embodiments. The RF power system 1000 includes the RF power supply system 160, the RF signal control circuits 164, analog summer/adder circuits 174, and the RF electrodes 130. Each RF signal control circuit 164 includes a respective voltage/power control circuit 1002 and a respective phase control circuit 1004. For example, the RF signal control circuit 164-1 includes a voltage/power control circuit 1002-1 and a phase control circuit 1004-1, and the RF signal control circuit **164-*n* includes a voltage/power control circuit 1002-*n* and a phase control circuit 1004-*n*. Each voltage/power control circuit 1002 has an input node that is the input node of the respective RF signal control circuit 164 and is electrically coupled to the output node of the RF power supply system 160. Each voltage/power control circuit 1002 has an output node electrically coupled to an input node of a respective phase control circuit 1004. Each phase control circuit 1004 has an output node that is the output node of the respective RF signal control circuit 164 that is electrically coupled to the first input node of a respective analog summer/adder circuit 174. The voltage/power control circuit 1002 and the phase control circuit 1004 of a respective RF signal control circuit 164 are communicatively coupled to, e.g., the controller 190 to receive one or more setpoints for the respective RF signal control circuit 164. The setpoint(s) is a digital number or code that selectively configures the gain of the voltage/power control circuit 1002 and the phase offset of the phase control circuit 1004**.

In some embodiments, a voltage/power control circuit 1002 can include an amplifier and a selectively configurable impedance network configured to receive an RF signal and output a gain-adjusted RF signal relative to the received RF signal. The selectively configurable impedance network can include a number of parallel connected switched resistors, for example. For example, a switched resistor can include a resistor electrically connected in series with a channel of a transistor. A signal, which can be a bit of the setpoint or a bit resulting from decoding the setpoint, for example, can be applied to the gate of the transistor to selectively cause the channel of the transistor to be in a conducting state or non-conducting state. By selectively electrically connecting and/or disconnecting resistors in parallel, the gain of the voltage/power control circuit 1002 can be selectively configured. A person having ordinary skill in the art will readily understand a configuration for a voltage/power control circuit 1002 and how such voltage/power control circuit 1002 can be selectively configurable to implement different gains, which may be by using any combination of impedance elements, such as resistors, capacitors, and/or inductors.

Similarly, in some embodiments, a phase control circuit 1004 can include an amplifier and a selectively configurable impedance network configured to receive an RF signal and output a phase-offset-adjusted RF signal relative to the received RF signal. The selectively configurable impedance network can include a number of parallel connected switched impedance elements, including, for example, resistors, capacitors, and/or inductors. A signal, which can be a bit of the setpoint or a bit resulting from decoding the setpoint, for example, can be applied to the gate of the transistor to selectively cause the channel of the transistor to be in a conducting state or non-conducting state. By selectively electrically connecting and/or disconnecting impedance elements in parallel, the phase offset of the phase control circuit 1004 can be selectively configured. A person having ordinary skill in the art will readily understand a configuration for a phase control circuit 1004 and how such phase control circuit 1004 can be selectively configurable to implement different phase offsets.

Figure 11:
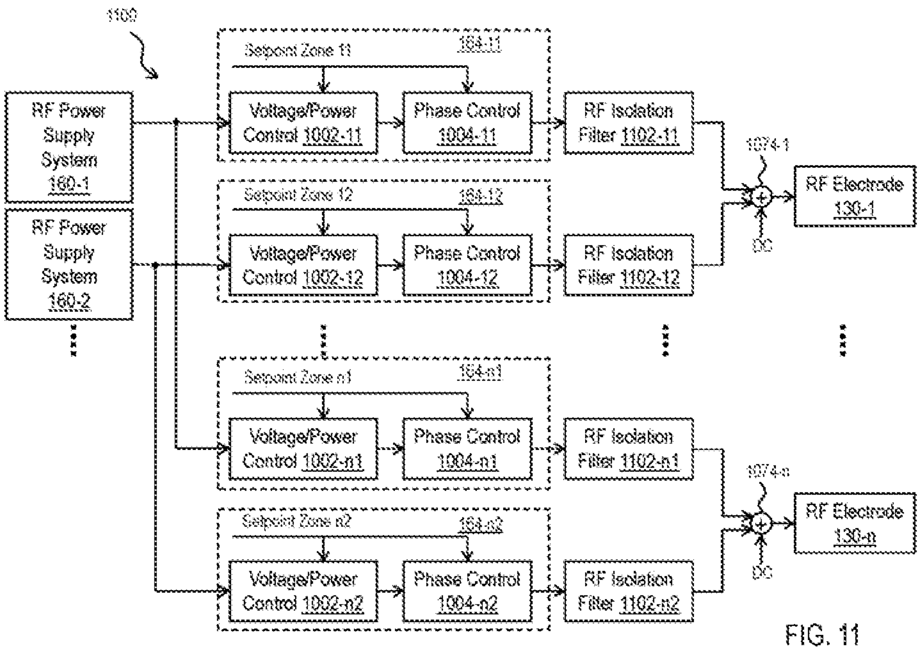
FIG. 11 is a schematic of an RF power system that may be implemented with the processing tool of FIGS. 1, 8, and 9 according to some embodiments.

FIG. 11 is a schematic of an RF power system 1100 that may be implemented with the processing tool 100, 800, 900 according to some embodiments. The RF power system 1100 of FIG. 11 is a modification of the RF power system 1000 of FIG. 10. The RF power system 1100 is a multi-frequency RF power system. The RF power system 1100 includes p number of RF power supply systems, of which two are shown (e.g., RF power supply systems 160-1, 160-2). Each RF power supply system 160 is configured to generate an RF signal at a target frequency, and the target frequencies of the RF power supply systems 160 can be different. For example, a target frequency of the RF power supply system 160-1 may be 13.56 MHz, and a target frequency of the RF power supply system 160-2 may be 60 MHz.

The RF power system 1100 includes n number of RF signal control circuits 164 for each RF power supply system 160. In total, the RF power system 1100 includes (n×p) number of RF signal control circuits 164. In the illustration, each RF signal control circuit 164 has a "-ij" designation appended thereto, where i indicates with which RF electrode 130 the given RF signal control circuit 164 is associated, and j indicates with which RF power supply system the given RF signal control circuit 164 is associated. Each RF signal control circuit 164 includes a voltage/power control circuit 1002 and a phase control circuit 1004 and is configured as described above with respect to FIG. 10.

For each RF power supply system 160, an output node of the respective RF power supply system 160 is electrically coupled to input nodes of n number of RF signal control circuits 164 associated with that RF power supply system 160. Each RF signal control circuit 164 has an output node electrically coupled to an input node of a respective RF isolation filter 1102 (which have a designation appended like with the RF signal control circuits 164). Each RF isolation filter 1102 is configured to pass an RF signal having the target frequency of the RF signal generated by the associated RF power supply system 160. Each RF isolation filter 1102 may remove or diminish any signal other than the signal at the target frequency. For example, an RF isolation filter 1102 can be a bandpass filter centered on the frequency of the RF signal generated by the associated RF power supply system 160.

The RF power system 1100 includes n number of analog summer/adder circuits 1074. Each analog summer/adder circuit 1074 has (p+1) number of input nodes and is associated with a respective RF electrode 130. Output nodes of respective RF isolation filters 1102 associated with a given RF electrode 130 are electrically coupled to respective input nodes of the analog summer/adder circuit 1074 associated with that given RF electrode 130. Additionally, a respective input node of each analog summer/adder circuit 1074 is electrically coupled to the output node of the DC power supply 170. Each analog summer/adder circuit 1074 is configured to sum the p number of RF signals received from the respective RF isolation filters 1102 and the DC voltage received from the DC power supply 170 to generate an RF/DC signal. Each analog summer/adder circuit 1074 has an output node electrically coupled to the RF electrode 130 with which the analog summer/adder circuit 1074 is associated. The RF/DC signal generated by the analog summer/adder circuit 1074 is output on the output node to the RF electrode 130. By having multiple RF power supply systems 160 that generate RF signals with different frequencies, an RF/DC signal can include multiple RF components that are applied to an RF electrode 130. Other aspects of the RF power system 1100 are apparent to a person having ordinary skill in the art in view of previous description, including description of the RF power system 1000 of FIG. 10.

Figure 12:
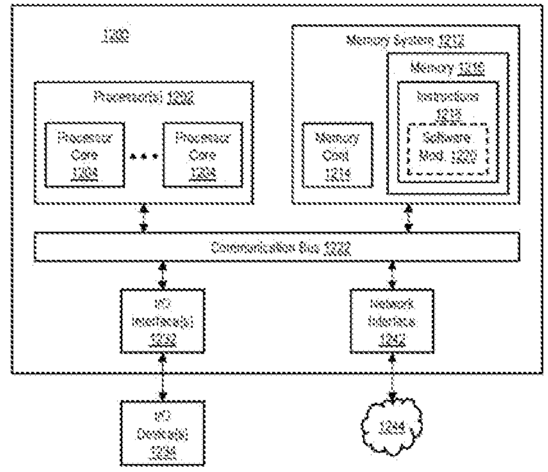
FIG. 12 is a processor-based system according to some embodiments.

FIG. 12 illustrates a processor-based system 1200 according to some embodiments. The processor-based system 1200 can be or include a computer, a server, a programmable logic controller (PLC), the like, or a combination thereof. The processor-based system 1200 may be implemented as the controller 190 or as any other processor-based system to implement any operations described herein. The processor-based system 1200 includes one or more processors 1202, a memory system 1212, a communication bus 1222, one or more input/output (I/O) interfaces 1232, and a network interface 1242.

Each processor 1202 can include one or more processor cores 1204. Each processor 1202 and/or processor core 1204 may be, for example, a hardened processor, such as a central processing unit (CPU), a reduced instruction set computing (RISC) processor, a complex instruction set computing (CISC) processor, a graphics processing unit (GPU), a digital signal processor (DSP), an application specific integrated circuit (ASIC), the like, or a combination thereof, or a soft processor implemented on programmable logic, such as a field programmable gate array (FPGA).

The memory system 1212 includes one or more memory controllers 1214 and memory 1216. The memory controllers 1214 are configured to control read and/or write access to a particular memory 1216 or subset of memory 1216. The memory 1216 may include main memory, disk storage, or any suitable combination thereof. The memory 1216 may include any type of volatile or nonvolatile memory, such as dynamic random access memory (DRAM), static random access memory (SRAM), erasable programmable read-only memory (EPROM), electrically erasable programmable read-only memory (EEPROM), Flash memory, solid-state storage, etc. The memory 1216 is a non-transitory machine-readable storage medium. Instructions 1218 are stored in the memory 1216. The instructions 1218 may be machine-executable code (e.g., machine code) and may comprise firmware, software, a program, an application, or other machine-executable code. The instructions 1218 can, for example, embody a software module 1220, which when executed by the one or more processors 1202, performs various functionality and operations described herein.

The one or more I/O interfaces 1232 are configured to be electrically and/or communicatively coupled to one or more I/O devices 1234. The I/O devices 1234 include the RF signal control circuits 164 and, if applicable, the RF bias control circuits 888. The RF signal control circuits 164 and RF bias control circuits 888 can receive respective setpoints via the I/O interface 1232. Other example I/O devices 1234 include a keyboard, a mouse, a display device, a printer, etc. The one or more I/O interfaces 1232 can include connectors or coupling circuitry, such as an industrial application connection, a universal serial bus (USB) connection, a high-definition multimedia interface (HDMI) connection, Bluetooth® circuitry, or the like.

The network interface 1242 is configured to be communicatively coupled to a network 1244. The network interface 1242 can include circuitry for wired communication, such as an Ethernet connection, and/or can include circuitry for wireless communication, such as a circuitry for Wi-Fi® communications. For example, one or more computers and/ or servers communicatively coupled to the network 1244 may communicate a recipe, process conditions, or the like to the processor-based system 1200 via the network 1244 and the network interface 1242.

The communication bus 1222 is communicatively connected to the one or more processors 1202, the memory system 1212, the one or more I/O interfaces 1232, and the network interface 1242. The various components can communicate between each other via the communication bus 1222. The communication bus 1222 can control the flow of communications, such as by including an arbiter to arbitrate the communications.

Figure 13:
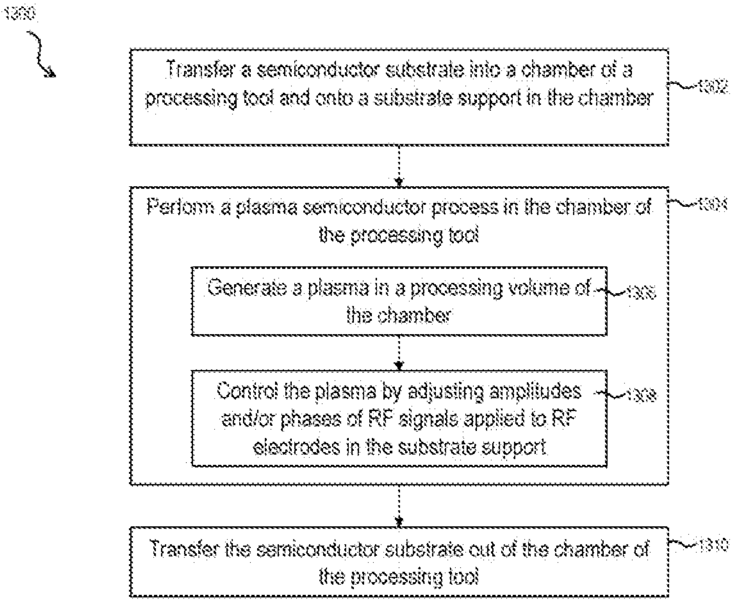
FIG. 13 is a flow chart of a method of semiconductor processing according to some embodiments.

FIG. 13 is a flow chart of a method 1300 of semiconductor processing according to some embodiments. The method 1300 can be implemented using the processing tool 100, 800, 900 previously described. The operations of the method 1300 can be initiated and/or controlled by the controller 190 (e.g., by execution of instructions 1218 by the one or more processors 1202). At block 1302, a semiconductor substrate 120 is transferred into a chamber 102 of a processing tool 100, 800, 900 and onto a substrate support 106 (e.g., an ESC 108) in the chamber 102. The substrate support 106 (e.g., the ESC 108 or mid-plate 902) includes n number of RF electrodes 130 as described above. The semiconductor substrate 120 can be secured to the substrate support 106 by applying a DC voltage to the RF electrodes 130 in the processing tool 100, 800 of FIG. 1 or 8, or by applying a DC voltage to the chuck electrodes 904 in the processing tool 900 of FIG. 9 (e.g., to chuck the semiconductor substrate 120). In the processing tool 100, 800 of FIG. 1 or 8, the DC voltage can be applied to the RF electrodes 130 using respective RF/DC signals as described above, where the RF/DC signals might not include an RF component at the time the semiconductor substrate 120 first becomes secured to the ESC 108.

At block 1304, plasma semiconductor process is performed in the chamber 102 of the processing tool 100, 800, 900. The plasma semiconductor process can be, for example, an etch process, a deposition process, or any other applicable process. Example plasma semiconductor processes include sputtering, PVD, MDP, PECVD, IBE, and RIE. Block 1304 includes, at block 1306, generating plasma in the processing volume 152 of the chamber 102. The semiconductor substrate 120 can be exposed to the plasma in the processing volume 152. The plasma can be generated by flowing a gas into the chamber 102 (e.g., from the gas supply system 146 and through the gas inlet 144, gas distribution plate 140, and gas showerhead 142) and applying respective RF/DC signals (that each includes an RF component) or respective RF signals to the RF electrodes 130. The plasma can be generated as a result of the RF components or RF signals on the RF electrodes 130 and the gas showerhead 142 being grounded. Block 1304 further includes, at block 1308, controlling the plasma by adjusting amplitudes and/or phases of RF signals applied to the RF electrodes 130 in the substrate support 106. Although described separately for ease of reference, blocks 1306, 1308 can be implemented by a same operation(s). In some embodiments, controlling the plasma can control the plasma at a periphery of the semiconductor substrate 120 relative to the center of the semiconductor substrate 120. In some embodiments, the plasma can be controlled differently between the periphery and center of the semiconductor substrate 120 by applying RF/DC signals having different respective RF components or different respective RF signals to different RF electrodes 130 at and near the edge of the semiconductor substrate 120 and proximate the center of the semiconductor substrate 120. The different RF components or signals can be implemented by selectively configuring the RF signal control circuits 164 to generate respective adjusted RF signals, which may have different amplitudes, phase offsets, or any permutation thereof. The RF signal control circuits 164 can be selectively configured according to setpoints communicated to the RF signal control circuits 164 from the controller 190. Additionally, biasing of the bias electrode(s) 136, 836 can be performed during blocks 1306, 1308. The biasing can include applying an RF bias signal to a single bias electrode 136, as in the processing tool 100, or applying respective RF bias signals to multiple bias electrodes 836, as in the processing tool 800.

At block 1310, the plasma semiconductor process is concluded, and the semiconductor substrate 120 is transferred out of the chamber 102 of the processing tool 100, 800, 900. At the conclusion of the plasma semiconductor process, the RF components of the DC/RF signals or RF signals can cease being applied to the RF electrodes 130 (e.g., turn off the RF power supply system(s) 160), and gas can cease being supplied into the chamber 102 and can be exhausted out of the chamber 102. Additionally, the RF bias signal(s) can cease being applied to the bias electrode(s) 136, 836. The DC component of the RF/DC signal can also be ceased (e.g., by turning off the DC power supply 170) to release the semiconductor substrate 120 from the ESC 108. Thereafter, the semiconductor substrate 120 can be transferred out of the chamber 102.

Figure 14:
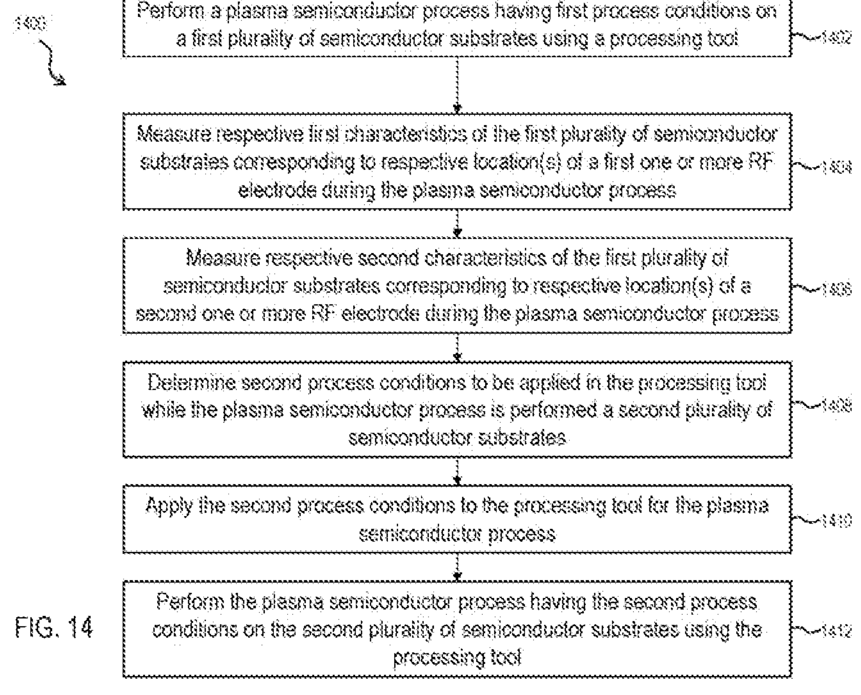
FIG. 14 is a flow chart of a method for semiconductor processing according to some embodiments.

FIG. 14 is a flow chart of a method 1400 for semiconductor processing according to some embodiments. At block 1402, plasma semiconductor process, like described with respect to FIG. 13, is performed on a first plurality of semiconductor substrates (e.g., one or more lots of semiconductor substrates) using a processing tool 100, 800, 900. The plasma process is performed having first process conditions. The first process conditions include setpoints of the RF signal control circuits 164 and where applicable, setpoints of the RF bias control circuits 888. Based on these setpoints, RF components of RF/DC signals or RF signals are applied to the respective RF electrodes 130 during the plasma semiconductor process, and an RF signal(s) is applied to the bias electrode(s) 136, 836 during the plasma semiconductor process.

At block 1404, respective first characteristics of the first plurality of semiconductor substrates corresponding to respective location(s) of a first one or more RF electrode 130 of the RF electrodes 130 during the plasma semiconductor process are measured, and at block 1406, respective second characteristics of the first plurality of semiconductor substrates corresponding to respective location(s) of a second one or more RF electrode 130 of the RF electrodes 130 during the plasma semiconductor process are measured. The location(s) of the first one or more RF electrode 130 differ from the location(s) of the second one or more RF electrode 130. In some embodiments, the first location(s) can be proximate respective centers of the first plurality of semiconductor substrates during the plasma semiconductor process, and the second location(s) can be proximate respective edges of the first plurality of semiconductor substrates during the plasma semiconductor process. The first characteristic and the second characteristics can be a same feature or component; the use of "first" and "second" is for ease of reference. The measuring can be performed by metrology tools. In some embodiments, the first and second characteristics can be or include profile angles of recesses etched by the plasma semiconductor process. In some embodiments, the first and second characteristics can be or include depths of recesses etched by the plasma semiconductor process. In some embodiments, the first and second characteristics can be or include thicknesses of films deposited by the plasma semiconductor process. Other characteristics may be measured. Variation between the first characteristics and the second characteristics can indicate non-uniformity of the plasma in the plasma semiconductor process when the first plurality of substrates were processed.

At block 1408, using one or more processor-based systems, second process conditions to be applied in the processing tool while the plasma semiconductor process is performed on a second plurality of semiconductor substrates are determined. The second process conditions are determined based on the first characteristics and the second characteristics measured in blocks 1404, 1406, such as differences between the first characteristics and the second characteristics. The second process conditions are respective same types of process conditions as the first process conditions, although the values or data of the first process conditions and the second process conditions may differ. As an example, a processor-based system operating an advanced process control (APC) algorithm may determine amplitudes and phase offsets of the RF components of the DC/RF signals or RF signals to be applied to the respective RF electrodes 130 and an amplitude(s) and a phase offset(s) of the RF bias signal(s) to be applied to the respective bias electrode(s) 136, 836. The processor-based system operating the APC algorithm may then determine setpoints at which to set the RF signal control circuits 164 and where applicable, the RF bias control circuits 888.

At block 1410, the second process conditions are applied to the processing tool for the plasma semiconductor process. For example, the processor-based system operating the APC algorithm may communicate the second process conditions (e.g., via network 1244) to the controller 190. The controller 190 can reset the recipe of the plasma semiconductor process to have the second process conditions and can communicate the second process conditions (e.g., the setpoints) to the RF signal control circuits 164 and where applicable, the RF bias control circuits 888, which causes those circuits to become selectively configured based on the second process conditions.

At block 1412, the plasma semiconductor process is performed on the second plurality of semiconductor substrates using the processing tool 100, 800, 900. The plasma process is performed having the second process conditions. Based on the setpoints of the second process conditions, RF components of RF/DC signals are applied to the RF electrodes 130 during the plasma semiconductor process, and an RF bias signal(s) is applied to the bias electrode(s) 136, 836 during the plasma semiconductor process.

A first embodiment is a processing tool for semiconductor processing. The processing tool includes a chamber and a substrate support. The chamber has an internal volume within the chamber. The substrate support is disposed in the internal volume in the chamber. The substrate support includes a support surface configured to support a semiconductor substrate in the internal volume in the chamber. The substrate support includes a plurality of radio frequency (RF) electrodes. A dimension of each lateral side of each RF electrode of the plurality of RF electrodes is equal to or less than 2% of a wavelength of an RF signal applied to the respective RF electrode. The respective dimension is in a plane parallel to the support surface. The plurality of RF electrodes is configured to, at least in part, control plasma in the internal volume in the chamber.

In the processing tool of the first embodiment, each RF electrode of the plurality of RF electrodes may be configured to have a voltage applied thereto independently of each other voltage applied to each other RF electrode of the plurality of RF electrodes.

In the processing tool of the first embodiment, the plurality of RF electrodes may be further configured to have a direct current (DC) voltage applied thereto for chucking the semiconductor substrate on the support surface.

In the processing tool of the first embodiment, the substrate support may include an electrostatic chuck. The electrostatic chuck can include the plurality of RF electrodes. The substrate support may further include a baseplate under the electrostatic chuck, and the baseplate may have a single bias electrode configured to have a bias RF signal applied thereto.

In the processing tool of the first embodiment, the substrate support may include an electrostatic chuck, and the electrostatic chuck may include the plurality of RF electrodes. The substrate support may further include a baseplate under the electrostatic chuck, and the baseplate may include a plurality of bias electrodes. Each bias electrode of the plurality of bias electrodes may be configured to have a respective bias signal applied thereto independently of each other bias signal applied to each other bias electrode of the plurality of bias electrodes.

The processing tool of the first embodiment may further include an RF power supply system and a plurality of RF signal control circuits. The RF power supply system may be configured to output an RF signal on an output node of the RF power supply system. Each RF signal control circuit of the plurality of RF signal control circuits may have an input node electrically coupled to the output node of the RF power supply system and may have an output node electrically coupled to a respective one RF electrode of the plurality of RF electrodes. Each RF signal control circuit of the plurality of RF signal control circuits may be controllable to adjust an amplitude and a phase of the RF signal and output a corresponding adjusted RF signal on the output node of the respective RF signal control circuit. Additionally, the processing tool may include a controller. The controller may include one or more processors and non-transitory memory. The non-transitory memory can include stored instructions, which when executed by the one or more processors, cause the one or more processors to control the plurality of RF signal control circuits to adjust the respective amplitude and the respective phase.

In the processing tool of the first embodiment, the plurality of RF electrodes may be arranged in a linear grid.

In the processing tool of the first embodiment, the plurality of RF electrodes may be arranged in segmented concentric rings encircling a segmented inner circle.

In the processing tool of the first embodiment, the plurality of RF electrodes may be arranged in radially aligned segmented concentric rings encircling a sectored inner circle.

In the processing tool of the first embodiment, the plurality of RF electrodes may be arranged in segmented concentric rings encircling a full inner circle.

In the processing tool of the first embodiment, the plurality of RF electrodes may be arranged in a sectored circle.

In the processing tool of the first embodiment, a dimension of each lateral side of each RF electrode of the plurality of RF electrodes may be equal to or less than 221.1 millimeters. The respective dimension may be in the plane parallel to the support surface.

In the processing tool of the first embodiment, a dimension of each lateral side of each RF electrode of the plurality of RF electrodes may be equal to or less than 199.9 millimeters. The respective dimension may be in the plane parallel to the support surface.

In the processing tool of the first embodiment, a dimension of each lateral side of each RF electrode of the plurality of RF electrodes may be in a range from 50.0 millimeters to 221.1 millimeters. The respective dimension may be in the plane parallel to the support surface.

In the processing tool of the first embodiment, a dimension of each lateral side of each RF electrode of the plurality of RF electrodes may be in a range from 50.0 millimeters to 199.9 millimeters. The respective dimension may be in the plane parallel to the support surface.

A second embodiment is a processing tool for semiconductor processing. The processing tool includes a chamber and a substrate support. The chamber has an internal volume within the chamber. The substrate support is disposed in the internal volume in the chamber. The substrate support includes a support surface configured to support a semiconductor substrate in the internal volume in the chamber. The substrate support includes a plurality of radio frequency (RF) electrodes configured to, at least in part, control plasma in the internal volume in the chamber. A first RF electrode of the plurality of RF electrodes is disposed proximate a center of the support surface, and a second RF electrode of the plurality of RF electrodes is disposed proximate a periphery of the support surface. The first RF electrode and the second RF electrode intersect, laterally between the center and the periphery, an axis parallel to a radial direction in the support surface.

In the processing tool of the second embodiment, each RF electrode of the plurality of RF electrodes may be configured to have a voltage applied thereto independently of each other voltage applied to each other RF electrode of the plurality of RF electrodes.

In the processing tool of the second embodiment, the plurality of RF electrodes may further be configured to have a direct current (DC) voltage applied thereto for chucking the semiconductor substrate on the support surface.

In the processing tool of the second embodiment, the substrate support may include an electrostatic chuck, and the electrostatic chuck may include the plurality of RF electrodes. The substrate support may further include a baseplate under the electrostatic chuck, and the baseplate may have a single bias electrode configured to have a bias RF signal applied thereto.

In the processing tool of the second embodiment, the substrate support may include an electrostatic chuck, and the electrostatic chuck may include the plurality of RF electrodes. The substrate support may further include a baseplate under the electrostatic chuck, and the baseplate may include a plurality of bias electrodes. Each bias electrode of the plurality of bias electrodes may be configured to have a respective bias signal applied thereto independently of each other bias signal applied to each other bias electrode of the plurality of bias electrodes.

The processing tool of the second embodiment may further include an RF power supply system and a plurality of RF signal control circuits. The RF power supply system may be configured to output an RF signal on an output node of the RF power supply system. Each RF signal control circuit of the plurality of RF signal control circuits may have an input node electrically coupled to the output node of the RF power supply system and may have an output node electrically coupled to a respective one RF electrode of the plurality of RF electrodes. Each RF signal control circuit of the plurality of RF signal control circuits may be controllable to adjust an amplitude and a phase of the RF signal and output a corresponding adjusted RF signal on the output node of the respective RF signal control circuit. Additionally, the processing tool may include a controller. The controller may include one or more processors and non-transitory memory. The non-transitory memory can include stored instructions, which when executed by the one or more processors, cause the one or more processors to control the plurality of RF signal control circuits to adjust the respective amplitude and the respective phase.

In the processing tool of the second embodiment, the plurality of RF electrodes may be arranged in a linear grid.

In the processing tool of the second embodiment, the plurality of RF electrodes may be arranged in segmented concentric rings encircling a segmented inner circle.

In the processing tool of the second embodiment, the plurality of RF electrodes may be arranged in radially aligned segmented concentric rings encircling a sectored inner circle.

In the processing tool of the second embodiment, the plurality of RF electrodes may be arranged in segmented concentric rings encircling a full inner circle.

In the processing tool of the second embodiment, a dimension of each lateral side of each RF electrode of the plurality of RF electrodes may be equal to or less than 221.1 millimeters. The respective dimension may be in a plane parallel to the support surface.

In the processing tool of the second embodiment, a dimension of each lateral side of each RF electrode of the plurality of RF electrodes may be equal to or less than 199.9 millimeters. The respective dimension may be in a plane parallel to the support surface.

In the processing tool of the second embodiment, a dimension of each lateral side of each RF electrode of the plurality of RF electrodes may be in a range from 50.0 millimeters to 221.1 millimeters. The respective dimension may be in a plane parallel to the support surface.

In the processing tool of the second embodiment, a dimension of each lateral side of each RF electrode of the plurality of RF electrodes may be in a range from 50.0 millimeters to 199.9 millimeters. The respective dimension may be in a plane parallel to the support surface.

A third embodiment is a processing tool for semiconductor processing. The processing tool includes a chamber and a substrate support. The chamber has an internal volume within the chamber. The substrate support is disposed in the internal volume in the chamber. The substrate support includes a support surface configured to support a semiconductor substrate in the internal volume in the chamber. The substrate support includes a plurality of radio frequency (RF) electrodes configured to, at least in part, control plasma in the internal volume in the chamber. A dimension of each lateral side of each RF electrode of the plurality of RF electrodes is equal to or less than 221.1 millimeters, and the respective dimension is in a plane parallel to the support surface.

In the processing tool of the third embodiment, each RF electrode of the plurality of RF electrodes may be configured to have a voltage applied thereto independently of each other voltage applied to each other RF electrode of the plurality of RF electrodes.

In the processing tool of the third embodiment, the plurality of RF electrodes may be further configured to have a direct current (DC) voltage applied thereto for chucking the semiconductor substrate on the support surface.

In the processing tool of the third embodiment, the substrate support may include an electrostatic chuck, and the electrostatic chuck may include the plurality of RF electrodes. The substrate support may further include a baseplate under the electrostatic chuck, and the baseplate may have a single bias electrode configured to have a bias RF signal applied thereto.

In the processing tool of the third embodiment, the substrate support may include an electrostatic chuck, and the electrostatic chuck may include the plurality of RF electrodes. The substrate support may further include a baseplate under the electrostatic chuck, and the baseplate may include a plurality of bias electrodes. Each bias electrode of the plurality of bias electrodes may be configured to have a respective bias signal applied thereto independently of each other bias signal applied to each other bias electrode of the plurality of bias electrodes.

The processing tool of the third embodiment may further include an RF power supply system and a plurality of RF signal control circuits. The RF power supply system may be configured to output an RF signal on an output node of the RF power supply system. Each RF signal control circuit of the plurality of RF signal control circuits may have an input node electrically coupled to the output node of the RF power supply system and may have an output node electrically coupled to a respective one RF electrode of the plurality of RF electrodes. Each RF signal control circuit of the plurality of RF signal control circuits may be controllable to adjust an amplitude and a phase of the RF signal and output a corresponding adjusted RF signal on the output node of the respective RF signal control circuit. Additionally, the processing tool may include a controller. The controller may include one or more processors and non-transitory memory. The non-transitory memory can include stored instructions, which when executed by the one or more processors, cause the one or more processors to control the plurality of RF signal control circuits to adjust the respective amplitude and the respective phase.

In the processing tool of the third embodiment, the plurality of RF electrodes may be arranged in a linear grid.

In the processing tool of the third embodiment, the plurality of RF electrodes may be arranged in segmented concentric rings encircling a segmented inner circle.

In the processing tool of the third embodiment, the plurality of RF electrodes may be arranged in radially aligned segmented concentric rings encircling a sectored inner circle.

In the processing tool of the third embodiment, the plurality of RF electrodes may be arranged in segmented concentric rings encircling a full inner circle.

In the processing tool of the third embodiment, the plurality of RF electrodes may be arranged in a sectored circle.

In the processing tool of the third embodiment, a dimension of each lateral side of each RF electrode of the plurality of RF electrodes may be greater than 50.0 millimeters. The respective dimension may be in the plane parallel to the support surface.

In the processing tool of the third embodiment, a dimension of each lateral side of each RF electrode of the plurality of RF electrodes may be equal to or less than 199.9 millimeters. The respective dimension may be in the plane parallel to the support surface.

In the processing tool of the third embodiment, a dimension of each lateral side of each RF electrode of the plurality of RF electrodes may be in a range from 50.0 millimeters to 199.9 millimeters. The respective dimension may be in the plane parallel to the support surface.

A fourth embodiment is a method for semiconductor processing. The method includes: generating plasma in a processing volume of a chamber of a processing tool. A substrate support is disposed in the chamber and supports, on a support surface, a semiconductor substrate. The semiconductor substrate is exposed to the plasma. The method further includes controlling the plasma including applying respective radio frequency (RF) signals to a plurality of RF electrodes disposed in the substrate support.

In the method of the fourth embodiment, a dimension of each lateral side of each RF electrode of the plurality of RF electrodes may be equal to or less than 2% of a wavelength of the respective RF signal applied to the respective RF electrode.

The method of the fourth embodiment may further include chucking the semiconductor substrate on the substrate support including applying a direct current (DC) voltage to the plurality of RF electrodes.

The method of the fourth embodiment may further include applying a bias RF signal to a bias electrode of a baseplate. The substrate support may include an electrostatic chuck, and the electrostatic chuck may include the plurality of RF electrodes. The substrate support may further include the baseplate disposed under the electrostatic chuck, and the baseplate may have a single bias electrode.

The method of the fourth embodiment may further include applying a plurality of bias RF signals to respective bias electrodes of a baseplate. The substrate support may include an electrostatic chuck, and the electrostatic chuck may include the plurality of RF electrodes. The substrate support may further include the baseplate disposed under the electrostatic chuck, and the baseplate may include the bias electrodes.

The method of the fourth embodiment may further include generating an initial RF signal by an RF power supply system, and by each RF signal control circuit of a plurality of RF signal control circuits, adjusting an amplitude, a phase offset, or a combination thereof of the initial RF signal to generate a respective RF signal of the RF signals applied to the plurality of RF electrodes.

In the method of the fourth embodiment, a first RF electrode of the plurality of RF electrodes may be disposed proximate a center of the semiconductor substrate, and a second RF electrode of the plurality of RF electrodes may be disposed proximate a periphery of the semiconductor substrate. The first RF electrode and the second RF electrode may intersect, laterally between the center and the periphery, an axis parallel to a radial direction in the support surface.

In the method of the fourth embodiment, the plurality of RF electrodes may be arranged in a linear grid.

In the method of the fourth embodiment, the plurality of RF electrodes may be arranged in segmented concentric rings encircling a segmented inner circle.

In the method of the fourth embodiment, the plurality of RF electrodes may be arranged in radially aligned segmented concentric rings encircling a sectored inner circle.

In the method of the fourth embodiment, the plurality of RF electrodes may be arranged in segmented concentric rings encircling a full inner circle.

In the method of the fourth embodiment, the plurality of RF electrodes may be arranged in a sectored circle.

In the method of the fourth embodiment, a dimension of each lateral side of each RF electrode of the plurality of RF electrodes may be equal to or less than 221.1 millimeters. The respective dimension may be in a plane parallel to the support surface.

In the method of the fourth embodiment, a dimension of each lateral side of each RF electrode of the plurality of RF electrodes may be equal to or less than 199.9 millimeters. The respective dimension may be in a plane parallel to the support surface.

In the method of the fourth embodiment, a dimension of each lateral side of each RF electrode of the plurality of RF electrodes may be in a range from 50.0 millimeters to 221.1 millimeters. The respective dimension may be in a plane parallel to the support surface.

In the method of the fourth embodiment, a dimension of each lateral side of each RF electrode of the plurality of RF electrodes may be in a range from 50.0 millimeters to 199.9 millimeters. The respective dimension may be in a plane parallel to the support surface.

A fifth embodiment is a method for semiconductor processing. The method includes performing plasma semiconductor process having first process conditions on a first plurality of substrates using a processing tool. The processing tool includes a substrate support configured to support a substrate during the plasma semiconductor process. The substrate support includes a plurality of radio frequency (RF) electrodes configured to control, at least in part, plasma of the plasma semiconductor process. The first process conditions correspond to amplitudes and phases of RF signals applied to the plurality of RF electrodes during the plasma semiconductor process. The method includes measuring respective first characteristics of the first plurality of substrates corresponding to a first location of a first RF electrode of the plurality of RF electrodes during the plasma semiconductor process. The first characteristics are formed by the plasma semiconductor process. The method includes measuring respective second characteristics of the first plurality of substrates corresponding to a second location of a second RF electrode of the plurality of RF electrodes during the plasma semiconductor process. The second characteristics are formed by the plasma semiconductor process. The second location is different from the first location. The method includes, by a processor-based system, determining second process conditions to be applied while performing the plasma semiconductor process on a second plurality of substrates based on the first characteristics and the second characteristics. The second process conditions correspond to amplitudes and phases of RF signals to be applied to the plurality of RF electrodes during the plasma semiconductor process. The method includes performing the plasma semiconductor process having the second process conditions on the second plurality of substrates using the processing tool.

In the method of the fifth embodiment, the first characteristics may include, for each substrate of the first plurality of substrates, a first profile angle of a recess etched into the respective substrate corresponding to the first location, and the second characteristics may include, for each substrate of the first plurality of substrates, a second profile angle of a recess etched into the respective substrate corresponding to the second location.

In the method of the fifth embodiment, the first characteristics may include, for each substrate of the first plurality of substrates, a first depth of a recess etched into the respective substrate corresponding to the first location, and the second characteristics may include, for each substrate of the first plurality of substrates, a second depth of a recess etched into the respective substrate corresponding to the second location.

In the method of the fifth embodiment, the first characteristics may include, for each substrate of the first plurality of substrates, a first thickness of a film deposited on the respective substrate corresponding to the first location, and the second characteristics may include, for each substrate of the first plurality of substrates, a second thickness of the film corresponding to the second location.

A sixth embodiment is a power system for semiconductor processing. The power system includes a first RF power supply system and a first plurality of RF signal control circuits. Each RF signal control circuit of the first plurality of RF signal control circuits has (i) an input node electrically coupled to an output node of the first RF power supply system and (ii) an output node configured to be electrically coupled to a respective RF electrode of an electrostatic chuck of a processing tool. Each RF signal control circuit of the first plurality of RF signal control circuits is configured to be controllable to alter an amplitude and a phase of an RF signal received on the respective input node and output an output RF signal on the output node of the respective RF signal control circuit based on the RF signal received on the respective input node. Each RF signal control circuit of the first plurality of RF signal control circuits is independently controllable from each other RF signal control circuit of the first plurality of RF signal control circuits.

In the sixth embodiment, the power system may further include a plurality of analog summer/adder circuits. Each analog summer/adder circuit of the analog summer/adder circuits including a first input node, a second input node, and an output node. The first input node of the respective analog summer/adder circuit is electrically coupled to the output node of a respective RF signal control circuit of the first plurality of RF signal control circuits. The second input nodes of the analog summer/adder circuits are configured to be electrically coupled to a DC power supply. The output node of each analog summer/adder circuit of the plurality of analog summer/adder circuits being configured to be electrically coupled to the respective RF electrode of the electrostatic chuck.

In the sixth embodiment, the power system may further include a second RF power supply system, a second plurality of RF signal control circuits, a first plurality of isolation filters, a second plurality of isolation filters, and a plurality of analog summer/adder circuits. Each RF signal control circuit of the second plurality of RF signal control circuits has (i) an input node electrically coupled to an output node of the second RF power supply system and (ii) an output node configured to be electrically coupled to a respective RF electrode of the electrostatic chuck of the processing tool. Each RF signal control circuit of the second plurality of RF signal control circuits is configured to be controllable to alter an amplitude and a phase of an RF signal received on the respective input node and output an output RF signal on the output node of the respective RF signal control circuit based on the RF signal received on the respective input node. Each RF signal control circuit of the second plurality of RF signal control circuits is independently controllable from each other RF signal control circuit of the second plurality of RF signal control circuits. Each isolation filter of the first plurality of isolation filters has an input node and an output node. The input node of the respective isolation filter of the first plurality of isolation filters is electrically coupled to an output node of a respective one RF signal control circuit of the first plurality of RF signal control circuits. Each isolation filter of the second plurality of isolation filters has an input node and an output node. The input node of the respective isolation filter of the second plurality of isolation filters is electrically coupled to an output node of a respective one RF signal control circuit of the second plurality of RF signal control circuits. Each analog summer/adder circuit of the plurality of analog summer/adder circuits includes a first input node, a second input node, and an output node. The first input node of the respective summer/adder circuit of the plurality of analog summer/adder circuits is electrically coupled to the output node of a respective isolation filter of the first plurality of isolation filters. The second input node of the respective summer/adder circuit of the plurality of analog summer/adder circuits is electrically coupled to the output node of a respective isolation filter of the second plurality of isolation filters. The output node of each analog summer/adder circuit of the plurality of analog summer/adder circuits being configured to be electrically coupled to the respective RF electrode of the electrostatic chuck.

Although various examples have been described in detail, it should be understood that various changes, substitutions, and alterations can be made therein without departing from the scope defined by the appended claims.

What is claimed is:

1. A processing tool for semiconductor processing, the processing tool comprising:
- a chamber having an internal volume within the chamber; and
- a substrate support disposed in the internal volume in the chamber, the substrate support comprising a support surface configured to support a semiconductor substrate in the internal volume in the chamber, the substrate support comprising a plurality of radio frequency (RF) electrodes, wherein a dimension of each lateral side of each RF electrode of the plurality of RF electrodes is equal to or less than 2% of a wavelength of an RF signal applied to the respective RF electrode, the respective dimension being in a plane parallel to the support surface, the plurality of RF electrodes being configured to, at least in part, control a plasma in the internal volume in the chamber.

2. The processing tool of claim 1, wherein each RF electrode of the plurality of RF electrodes is configured to have a voltage applied thereto independently of each other voltage applied to each other RF electrode of the plurality of RF electrodes.

3. The processing tool of claim 1, wherein the plurality of RF electrodes are further configured to have a direct current (DC) voltage applied thereto for chucking the semiconductor substrate on the support surface.

4. The processing tool of claim 1, wherein the substrate support comprises an electrostatic chuck, the electrostatic chuck comprising the plurality of RF electrodes, the substrate support further comprising a baseplate under the electrostatic chuck, the baseplate having a single bias electrode configured to have a bias RF signal applied thereto.

5. The processing tool of claim 1, wherein the substrate support comprises an electrostatic chuck, the electrostatic chuck comprising the plurality of RF electrodes, the substrate support further comprises a baseplate under the electrostatic chuck, the baseplate comprising a plurality of bias electrodes, each bias electrode of the plurality of bias electrodes being configured to have a respective bias signal applied thereto independently of each other bias signal applied to each other bias electrode of the plurality of bias electrodes.

6. The processing tool of claim 1 further comprising:
- an RF power supply system configured to output an RF signal on an output node of the RF power supply system; and
- a plurality of RF signal control circuits, each RF signal control circuit of the plurality of RF signal control circuits having an input node electrically coupled to the output node of the RF power supply system and having an output node electrically coupled to a respective one RF electrode of the plurality of RF electrodes, each RF signal control circuit of the plurality of RF signal control circuits being controllable to adjust an amplitude and a phase of the RF signal and output a corresponding adjusted RF signal on the output node of the respective RF signal control circuit.

7. The processing tool of claim 6 further comprising:
- a controller comprising:
  - one or more processors; and
  - non-transitory memory comprising stored instructions, which when executed by the one or more processors, cause the one or more processors to control the plurality of RF signal control circuits to adjust the respective amplitude and the respective phase.

8. The processing tool of claim 1, wherein the plurality of RF electrodes are arranged in a linear grid.

9. The processing tool of claim 1, wherein the plurality of RF electrodes are arranged in segmented concentric rings encircling a segmented inner circle.

10. The processing tool of claim 1, wherein the plurality of RF electrodes are arranged in radially aligned segmented concentric rings encircling a sectored inner circle.

11. The processing tool of claim 1, wherein the plurality of RF electrodes are arranged in segmented concentric rings encircling a full inner circle.

12. The processing tool of claim 1, wherein the plurality of RF electrodes are arranged in a sectored circle.

13. The processing tool of claim 1, wherein a dimension of each lateral side of each RF electrode of the plurality of RF electrodes is equal to or less than 221.1 millimeters, the respective dimension being in the plane parallel to the support surface.

14. The processing tool of claim 1, wherein a dimension of each lateral side of each RF electrode of the plurality of RF electrodes is equal to or less than 199.9 millimeters, the respective dimension being in the plane parallel to the support surface.

15. The processing tool of claim 1, wherein a dimension of each lateral side of each RF electrode of the plurality of RF electrodes is in a range from 50.0 millimeters to 221.1 millimeters, the respective dimension being in the plane parallel to the support surface.

16. The processing tool of claim 1, wherein a dimension of each lateral side of each RF electrode of the plurality of RF electrodes is in a range from 50.0 millimeters to 199.9 millimeters, the respective dimension being in the plane parallel to the support surface.

17. A processing tool for semiconductor processing, the processing tool comprising:
- a chamber having an internal volume within the chamber; and
- a substrate support disposed in the internal volume in the chamber, the substrate support comprising a support surface configured to support a semiconductor substrate in the internal volume in the chamber, the substrate support comprising a plurality of radio frequency (RF) electrodes configured to, at least in part, control a plasma in the internal volume in the chamber, a first RF electrode of the plurality of RF electrodes being disposed proximate a center of the support surface, a second RF electrode of the plurality of RF electrodes being disposed proximate a periphery of the support surface, the first RF electrode and the second RF electrode intersecting, laterally between the center and the periphery, an axis parallel to a radial direction in the support surface.

18. The processing tool of claim 17, wherein each RF electrode of the plurality of RF electrodes is configured to have a voltage applied thereto independently of each other voltage applied to each other RF electrode of the plurality of RF electrodes.

19. The processing tool of claim 17, wherein the plurality of RF electrodes are further configured to have a direct current (DC) voltage applied thereto for chucking the semiconductor substrate on the support surface.

20. The processing tool of claim 17, wherein the substrate support comprises an electrostatic chuck, the electrostatic chuck comprising the plurality of RF electrodes, the substrate support further comprising a baseplate under the electrostatic chuck, the baseplate having a single bias electrode configured to have a bias RF signal applied thereto.

21. The processing tool of claim 17, wherein the substrate support comprises an electrostatic chuck, the electrostatic chuck comprising the plurality of RF electrodes, the substrate support further comprises a baseplate under the electrostatic chuck, the baseplate comprising a plurality of bias electrodes, each bias electrode of the plurality of bias electrodes being configured to have a respective bias signal applied thereto independently of each other bias signal applied to each other bias electrode of the plurality of bias electrodes.

22. The processing tool of claim 17 further comprising:

an RF power supply system configured to output an RF signal on an output node of the RF power supply system; and a plurality of RF signal control circuits, each RF signal control circuit of the plurality of RF signal control circuits having an input node electrically coupled to the output node of the RF power supply system and having an output node electrically coupled to a respective one RF electrode of the plurality of RF electrodes, each RF signal control circuit of the plurality of RF signal control circuits being controllable to adjust an amplitude and a phase of the RF signal and output a corresponding adjusted RF signal on the output node of the respective RF signal control circuit.

23. The processing tool of claim 22 further comprising:

a controller comprising:

one or more processors; and non-transitory memory comprising stored instructions, which when executed by the one or more processors, cause the one or more processors to control the plurality of RF signal control circuits to adjust the respective amplitude and the respective phase.

24. The processing tool of claim 17, wherein the plurality of RF electrodes are arranged in a linear grid.

25. The processing tool of claim 17, wherein the plurality of RF electrodes are arranged in segmented concentric rings encircling a segmented inner circle.

26. The processing tool of claim 17, wherein the plurality of RF electrodes are arranged in radially aligned segmented concentric rings encircling a sectored inner circle.

27. The processing tool of claim 17, wherein the plurality of RF electrodes are arranged in segmented concentric rings encircling a full inner circle.

28. The processing tool of claim 17, wherein a dimension of each lateral side of each RF electrode of the plurality of RF electrodes is equal to or less than 221.1 millimeters, the respective dimension being in a plane parallel to the support surface.

29. The processing tool of claim 17, wherein a dimension of each lateral side of each RF electrode of the plurality of RF electrodes is equal to or less than 199.9 millimeters, the respective dimension being in a plane parallel to the support surface.

30. The processing tool of claim 17, wherein a dimension of each lateral side of each RF electrode of the plurality of RF electrodes is in a range from 50.0 millimeters to 221.1 millimeters, the respective dimension being in a plane parallel to the support surface.

31. The processing tool of claim 17, wherein a dimension of each lateral side of each RF electrode of the plurality of RF electrodes is in a range from 50.0 millimeters to 199.9 millimeters, the respective dimension being in a plane parallel to the support surface.

32. A processing tool for semiconductor processing, the processing tool comprising:

a chamber having an internal volume within the chamber; and a substrate support disposed in the internal volume in the chamber, the substrate support comprising a support surface configured to support a semiconductor substrate in the internal volume in the chamber, the substrate support comprising a plurality of radio frequency (RF) electrodes configured to, at least in part, control a plasma in the internal volume in the chamber, a dimension of each lateral side of each RF electrode of the plurality of RF electrodes being equal to or less than 221.1 millimeters, the respective dimension being in a plane parallel to the support surface.

33. The processing tool of claim 32, wherein each RF electrode of the plurality of RF electrodes is configured to have a voltage applied thereto independently of each other voltage applied to each other RF electrode of the plurality of RF electrodes.

34. The processing tool of claim 32, wherein the plurality of RF electrodes are further configured to have a direct current (DC) voltage applied thereto for chucking the semiconductor substrate on the support surface.

35. The processing tool of claim 32, wherein the substrate support comprises an electrostatic chuck, the electrostatic chuck comprising the plurality of RF electrodes, the substrate support further comprising a baseplate under the electrostatic chuck, the baseplate having a single bias electrode configured to have a bias RF signal applied thereto.

36. The processing tool of claim 32, wherein the substrate support comprises an electrostatic chuck, the electrostatic chuck comprising the plurality of RF electrodes, the substrate support further comprises a baseplate under the electrostatic chuck, the baseplate comprising a plurality of bias electrodes, each bias electrode of the plurality of bias electrodes being configured to have a respective bias signal applied thereto independently of each other bias signal applied to each other bias electrode of the plurality of bias electrodes.

37. The processing tool of claim 32 further comprising:

an RF power supply system configured to output an RF signal on an output node of the RF power supply system; and a plurality of RF signal control circuits, each RF signal control circuit of the plurality of RF signal control circuits having an input node electrically coupled to the output node of the RF power supply system and having an output node electrically coupled to a respective one RF electrode of the plurality of RF electrodes, each RF signal control circuit of the plurality of RF signal control circuits being controllable to adjust an amplitude and a phase of the RF signal and output a corresponding adjusted RF signal on the output node of the respective RF signal control circuit.

38. The processing tool of claim 37 further comprising:

a controller comprising:

one or more processors; and non-transitory memory comprising stored instructions, which when executed by the one or more processors, cause the one or more processors to control the plurality of RF signal control circuits to adjust the respective amplitude and the respective phase.

39. The processing tool of claim 32, wherein the plurality of RF electrodes are arranged in a linear grid.

40. The processing tool of claim 32, wherein the plurality of RF electrodes are arranged in segmented concentric rings encircling a segmented inner circle.

41. The processing tool of claim 32, wherein the plurality of RF electrodes are arranged in radially aligned segmented concentric rings encircling a sectored inner circle.

42. The processing tool of claim 32, wherein the plurality of RF electrodes are arranged in segmented concentric rings encircling a full inner circle.

43. The processing tool of claim 32, wherein the plurality of RF electrodes are arranged in a sectored circle.

44. The processing tool of claim 32, wherein a dimension of each lateral side of each RF electrode of the plurality of RF electrodes is greater than 50.0 millimeters, the respective dimension being in the plane parallel to the support surface.

45. The processing tool of claim 32, wherein a dimension of each lateral side of each RF electrode of the plurality of RF electrodes is equal to or less than 199.9 millimeters, the respective dimension being in the plane parallel to the support surface.

46. The processing tool of claim 32, wherein a dimension of each lateral side of each RF electrode of the plurality of RF electrodes is in a range from 50.0 millimeters to 199.9 millimeters, the respective dimension being in the plane parallel to the support surface.

47. A method for semiconductor processing using the processing tool according to claim 1, the method comprising:

generating a plasma in a processing volume of the chamber of the processing tool, the semiconductor substrate supported by the substrate support being exposed to the plasma; and controlling the plasma comprising applying respective radio frequency (RF) signals to a plurality of RF electrodes disposed in the substrate support.

48. The method of claim 47 further comprising chucking the semiconductor substrate on the substrate support comprising applying a direct current (DC) voltage to the plurality of RF electrodes.

49. The method of claim 47 further comprising applying a bias RF signal to a bias electrode of a baseplate, the substrate support comprising an electrostatic chuck, the electrostatic chuck comprising the plurality of RF electrodes, the substrate support further comprising the baseplate disposed under the electrostatic chuck, the baseplate having a single bias electrode.

50. The method of claim 47 further comprising applying a plurality of bias RF signals to respective bias electrodes of a baseplate, the substrate support comprising an electrostatic chuck, the electrostatic chuck comprising the plurality of RF electrodes, the substrate support further comprising the baseplate disposed under the electrostatic chuck, the baseplate comprising the bias electrodes.

51. The method of claim 47 further comprising:

generating an initial RF signal by an RF power supply system; and by each RF signal control circuit of a plurality of RF signal control circuits, adjusting an amplitude, a phase offset, or a combination thereof of the initial RF signal to generate a respective RF signal of the RF signals applied to the plurality of RF electrodes.

52. The method of claim 47, wherein:

a first RF electrode of the plurality of RF electrodes is disposed proximate a center of the semiconductor substrate;

a second RF electrode of the plurality of RF electrodes is disposed proximate a periphery of the semiconductor substrate; and the first RF electrode and the second RF electrode intersect, laterally between the center and the periphery, an axis parallel to a radial direction in the support surface.

53. The method of claim 47, wherein the plurality of RF electrodes are arranged in a linear grid.

54. The method of claim 47, wherein the plurality of RF electrodes are arranged in segmented concentric rings encircling a segmented inner circle.

55. The method of claim 47, wherein the plurality of RF electrodes are arranged in radially aligned segmented concentric rings encircling a sectored inner circle.

56. The method of claim 47, wherein the plurality of RF electrodes are arranged in segmented concentric rings encircling a full inner circle.

57. The method of claim 47, wherein the plurality of RF electrodes are arranged in a sectored circle.

58. The method of claim 47, wherein a dimension of each lateral side of each RF electrode of the plurality of RF electrodes is equal to or less than 221.1 millimeters, the respective dimension being in a plane parallel to the support surface.

59. The method of claim 47, wherein a dimension of each lateral side of each RF electrode of the plurality of RF electrodes is equal to or less than 199.9 millimeters, the respective dimension being in a plane parallel to the support surface.

60. The method of claim 47, wherein a dimension of each lateral side of each RF electrode of the plurality of RF electrodes is in a range from 50.0 millimeters to 221.1 millimeters, the respective dimension being in a plane parallel to the support surface.

61. The method of claim 47, wherein a dimension of each lateral side of each RF electrode of the plurality of RF electrodes is in a range from 50.0 millimeters to 199.9 millimeters, the respective dimension being in a plane parallel to the support surface.

62. A method for semiconductor processing using the processing tool according to claim 17, the method comprising:

performing a plasma semiconductor process having first process conditions on a first plurality of substrates using the processing tool, the processing tool comprising the substrate support configured to support a substrate during the plasma semiconductor process, the substrate support comprising the plurality of radio frequency (RF) electrodes configured to control, at least in part, a plasma of the plasma semiconductor process, the first process conditions corresponding to amplitudes and phases of RF signals applied to the plurality of RF electrodes during the plasma semiconductor process;

measuring respective first characteristics of the first plurality of substrates corresponding to a first location of a first RF electrode of the plurality of RF electrodes during the plasma semiconductor process, the first characteristics being formed by the plasma semiconductor process;

measuring respective second characteristics of the first plurality of substrates corresponding to a second location of a second RF electrode of the plurality of RF electrodes during the plasma semiconductor process, the second characteristics being formed by the plasma semiconductor process, the second location being different from the first location;

by a processor-based system, determining second process conditions to be applied while performing the plasma semiconductor process on a second plurality of substrates based on the first characteristics and the second characteristics, the second process conditions corresponding to amplitudes and phases of RF signals to be applied to the plurality of RF electrodes during the plasma semiconductor process; and performing the plasma semiconductor process having the second process conditions on the second plurality of substrates using the processing tool.

63. The method of claim 62, wherein:

the first characteristics include, for each substrate of the first plurality of substrates, a first profile angle of a recess etched into the respective substrate corresponding to the first location; and the second characteristics include, for each substrate of the first plurality of substrates, a second profile angle of a recess etched into the respective substrate corresponding to the second location.

64. The method of claim 62, wherein:

the first characteristics include, for each substrate of the first plurality of substrates, a first depth of a recess etched into the respective substrate corresponding to the first location; and the second characteristics include, for each substrate of the first plurality of substrates, a second depth of a recess etched into the respective substrate corresponding to the second location.

65. The method of claim 62, wherein:

the first characteristics include, for each substrate of the first plurality of substrates, a first thickness of a film deposited on the respective substrate corresponding to the first location; and the second characteristics include, for each substrate of the first plurality of substrates, a second thickness of the film corresponding to the second location.

* * * * *